(12) United States Patent
Rosenberg et al.

(10) Patent No.: US 9,740,341 B1
(45) Date of Patent: Aug. 22, 2017

(54) CAPACITIVE SENSING WITH INTERPOLATING FORCE-SENSITIVE RESISTOR ARRAY

(75) Inventors: Ilya D. Rosenberg, Mountain View, CA (US); Julien G. Beguin, San Francisco, CA (US)

(73) Assignee: Amazon Technologies, Inc., Seattle, WA (US)

( * ) Notice: Subject to any disclaimer, the term of this patent is extended or adjusted under 35 U.S.C. 154(b) by 320 days.

(21) Appl. No.: 12/846,497

(22) Filed: Jul. 29, 2010

Related U.S. Application Data

(63) Continuation-in-part of application No. 12/380,350, filed on Feb. 26, 2009.

(60) Provisional application No. 61/230,592, filed on Jul. 31, 2009.

(51) Int. Cl.
| | |
|---|---|
| *G06F 3/041* | (2006.01) |
| *G06F 3/044* | (2006.01) |
| *G06F 3/045* | (2006.01) |
| G06F 3/0488 | (2013.01) |
| G06F 3/0354 | (2013.01) |

(52) U.S. Cl.
CPC ............. *G06F 3/044* (2013.01); *G06F 3/041* (2013.01); *G06F 3/045* (2013.01); *G06F 3/0414* (2013.01); *G06F 3/03545* (2013.01); *G06F 3/0412* (2013.01); *G06F 3/04883* (2013.01); *G06F 2203/04104* (2013.01); *G06F 2203/04106* (2013.01); *G06F 2203/04112* (2013.01)

(58) Field of Classification Search
USPC ....................................................... 345/174
See application file for complete search history.

(56) References Cited

U.S. PATENT DOCUMENTS

| | | | |
|---|---|---|---|
| 3,944,740 A | * | 3/1976 | Murase ................. G03B 15/00 178/18.05 |
| 4,526,043 A | | 7/1985 | Boie et al. |
| 4,587,378 A | * | 5/1986 | Moore .......................... 345/173 |
| 4,952,031 A | | 8/1990 | Tsunoda et al. |
| 4,983,786 A | | 1/1991 | Stevens |
| 5,105,548 A | | 4/1992 | Fowler |
| 5,543,589 A | | 8/1996 | Buchana et al. |
| 5,597,183 A | | 1/1997 | Johnson |

(Continued)

FOREIGN PATENT DOCUMENTS

| | | |
|---|---|---|
| JP | 09282100 | 10/2007 |
| WO | WO2007/141566 A2 | 12/2007 |

(Continued)

OTHER PUBLICATIONS

Ashbrook, et al., "Nenya: Subtle and Eyes-Free Mobile Input with a Magnetically-Tracked Finger Ring", CHI 2011, May 7-12, 2011, 4 pages.

(Continued)

*Primary Examiner* — Jose Soto Lopez
(74) *Attorney, Agent, or Firm* — Lee & Hayes, PLLC

(57) ABSTRACT

An combination interpolating force sensitive resistor (IFSR) array touch sensor and capacitive touch sensor, or a modified IFSR sensor, is configured to detect touches resistively and capacitvely. By comparing resistive and capacitive signals, touches may be accurately characterized. The IFSR array may also be used in conjunction with an active stylus to determine a position of the active stylus relative to the IFSR array.

22 Claims, 15 Drawing Sheets

(56) References Cited

U.S. PATENT DOCUMENTS

| | | | |
|---|---|---|---|
| 5,666,113 A | 9/1997 | Logan | |
| 5,761,485 A | 6/1998 | Munyan | |
| 5,818,430 A * | 10/1998 | Heiser | 345/174 |
| 5,825,352 A | 10/1998 | Bisset et al. | |
| 5,847,698 A | 12/1998 | Reavey et al. | |
| 6,029,214 A | 2/2000 | Dorfman et al. | |
| 6,072,474 A | 6/2000 | Morimura et al. | |
| 6,128,007 A | 10/2000 | Seybold | |
| 6,229,502 B1 | 5/2001 | Schwab | |
| 6,392,636 B1 * | 5/2002 | Ferrari et al. | 345/173 |
| 6,594,606 B2 | 7/2003 | Everitt | |
| 6,707,438 B1 | 3/2004 | Ishizuka et al. | |
| 6,762,752 B2 | 7/2004 | Perski et al. | |
| 6,980,202 B2 * | 12/2005 | Carro | 345/173 |
| 6,982,699 B1 | 1/2006 | Lenssen et al. | |
| 7,123,243 B2 | 10/2006 | Kawasaki et al. | |
| 7,166,966 B2 | 1/2007 | Naugler, Jr. et al. | |
| 7,190,348 B2 | 3/2007 | Kennedy et al. | |
| 7,199,322 B2 | 4/2007 | Bourdelais et al. | |
| 7,324,093 B1 | 1/2008 | Gettemy et al. | |
| 7,331,245 B2 | 2/2008 | Nishimura et al. | |
| 7,339,577 B2 * | 3/2008 | Sato et al. | 345/173 |
| 7,471,284 B2 | 12/2008 | Bathiche et al. | |
| 7,619,616 B2 | 11/2009 | Rimas Ribikauskas et al. | |
| 7,760,187 B2 | 7/2010 | Kennedy | |
| 7,800,586 B2 | 9/2010 | Serban et al. | |
| 7,825,905 B2 | 11/2010 | Philipp | |
| 8,089,470 B1 | 1/2012 | Schediwy et al. | |
| 8,223,278 B2 | 7/2012 | Kim et al. | |
| 8,243,424 B1 | 8/2012 | Babu et al. | |
| 8,265,717 B2 | 9/2012 | Gorsica et al. | |
| 8,316,324 B2 | 11/2012 | Boillot | |
| 8,427,424 B2 | 4/2013 | Hartmann et al. | |
| 8,558,767 B2 | 10/2013 | Kwon | |
| 8,902,174 B1 | 12/2014 | Peterson | |
| 8,947,351 B1 | 2/2015 | Noble | |
| 9,069,417 B2 | 6/2015 | Rimon et al. | |
| 9,244,562 B1 | 1/2016 | Rosenberg et al. | |
| 2001/0013855 A1 * | 8/2001 | Fricker et al. | 345/156 |
| 2002/0015024 A1 | 2/2002 | Westerman et al. | |
| 2002/0080123 A1 | 6/2002 | Kennedy et al. | |
| 2002/0109668 A1 | 8/2002 | Rosenberg et al. | |
| 2002/0149572 A1 | 10/2002 | Schulz et al. | |
| 2002/0180714 A1 | 12/2002 | Duret | |
| 2003/0067449 A1 | 4/2003 | Yoshikawa et al. | |
| 2003/0095115 A1 | 5/2003 | Brian et al. | |
| 2003/0156098 A1 | 8/2003 | Shaw et al. | |
| 2003/0210235 A1 | 11/2003 | Roberts | |
| 2003/0234768 A1 | 12/2003 | Rekimoto et al. | |
| 2004/0125087 A1 * | 7/2004 | Taylor et al. | 345/173 |
| 2004/0174324 A1 | 9/2004 | Yamazaki et al. | |
| 2005/0083316 A1 | 4/2005 | Brian et al. | |
| 2005/0162402 A1 | 7/2005 | Watanachote | |
| 2005/0174336 A1 | 8/2005 | Nakayama et al. | |
| 2005/0200798 A1 * | 9/2005 | Tanaka | 349/155 |
| 2005/0259087 A1 | 11/2005 | Hoshino et al. | |
| 2006/0007172 A1 | 1/2006 | Baker et al. | |
| 2006/0007182 A1 | 1/2006 | Sato et al. | |
| 2006/0012580 A1 * | 1/2006 | Perski et al. | 345/173 |
| 2006/0012581 A1 | 1/2006 | Haim et al. | |
| 2006/0028459 A1 | 2/2006 | Underwood et al. | |
| 2006/0050062 A1 | 3/2006 | Ozawa et al. | |
| 2006/0097991 A1 * | 5/2006 | Hotelling et al. | 345/173 |
| 2006/0109252 A1 * | 5/2006 | Kolmykov-Zotov et al. | 345/173 |
| 2006/0192726 A1 | 8/2006 | Huitema et al. | |
| 2006/0198080 A1 | 9/2006 | Hawes et al. | |
| 2006/0209045 A1 | 9/2006 | Su et al. | |
| 2006/0236263 A1 | 10/2006 | Bathiche et al. | |
| 2006/0244735 A1 | 11/2006 | Wilson | |
| 2006/0293864 A1 | 12/2006 | Soss | |
| 2007/0128948 A1 * | 6/2007 | Nakanishi et al. | 439/660 |
| 2007/0152976 A1 | 7/2007 | Townsend et al. | |
| 2007/0235231 A1 | 10/2007 | Loomis et al. | |
| 2007/0236618 A1 | 10/2007 | Maag et al. | |
| 2007/0262246 A1 | 11/2007 | Pittel et al. | |
| 2008/0018608 A1 * | 1/2008 | Serban et al. | 345/173 |
| 2008/0018611 A1 * | 1/2008 | Serban et al. | 345/173 |
| 2008/0030464 A1 | 2/2008 | Sohm et al. | |
| 2008/0053293 A1 | 3/2008 | Georges et al. | |
| 2008/0074400 A1 | 3/2008 | Gettemy et al. | |
| 2008/0143679 A1 | 6/2008 | Harmon et al. | |
| 2008/0158183 A1 | 7/2008 | Hotelling et al. | |
| 2008/0160656 A1 | 7/2008 | Chanda et al. | |
| 2008/0168403 A1 | 7/2008 | Westerman et al. | |
| 2008/0180406 A1 | 7/2008 | Han et al. | |
| 2008/0204426 A1 | 8/2008 | Hotelling et al. | |
| 2008/0211796 A1 | 9/2008 | Kim | |
| 2008/0246723 A1 | 10/2008 | Baumbach | |
| 2008/0254822 A1 | 10/2008 | Tilley | |
| 2008/0296073 A1 | 12/2008 | McDermid | |
| 2008/0303799 A1 | 12/2008 | Schwesig et al. | |
| 2008/0309631 A1 | 12/2008 | Westerman et al. | |
| 2009/0095540 A1 | 4/2009 | Zachut et al. | |
| 2009/0102805 A1 | 4/2009 | Meijer et al. | |
| 2009/0120696 A1 * | 5/2009 | Hayakawa et al. | 178/18.05 |
| 2009/0141008 A1 | 6/2009 | Johnson et al. | |
| 2009/0153152 A1 * | 6/2009 | Maharyta | G01R 27/2605 324/684 |
| 2009/0165296 A1 | 7/2009 | Carmi | |
| 2009/0174679 A1 | 7/2009 | Westerman | |
| 2009/0218310 A1 | 9/2009 | Zu et al. | |
| 2009/0219258 A1 | 9/2009 | Geaghan et al. | |
| 2009/0227295 A1 | 9/2009 | Kim | |
| 2009/0237371 A1 | 9/2009 | Kim et al. | |
| 2009/0237374 A1 | 9/2009 | Li et al. | |
| 2009/0249236 A1 | 10/2009 | Westerman et al. | |
| 2009/0256817 A1 | 10/2009 | Perlin et al. | |
| 2009/0289914 A1 | 11/2009 | Cho | |
| 2009/0315848 A1 | 12/2009 | Ku et al. | |
| 2010/0005427 A1 | 1/2010 | Zhang et al. | |
| 2010/0006350 A1 | 1/2010 | Elias | |
| 2010/0013780 A1 | 1/2010 | Ikeda et al. | |
| 2010/0013797 A1 | 1/2010 | Kim et al. | |
| 2010/0020043 A1 | 1/2010 | Park et al. | |
| 2010/0026647 A1 | 2/2010 | Abe et al. | |
| 2010/0039395 A1 | 2/2010 | Nurmi et al. | |
| 2010/0056277 A1 | 3/2010 | Marks et al. | |
| 2010/0090964 A1 | 4/2010 | Soo et al. | |
| 2010/0117974 A1 | 5/2010 | Joguet et al. | |
| 2010/0123670 A1 | 5/2010 | Philipp | |
| 2010/0139990 A1 | 6/2010 | Westerman et al. | |
| 2010/0156805 A1 | 6/2010 | Brand et al. | |
| 2010/0182285 A1 | 7/2010 | Tremblay | |
| 2010/0199221 A1 | 8/2010 | Yeung et al. | |
| 2010/0225604 A1 | 9/2010 | Homma et al. | |
| 2010/0267421 A1 | 10/2010 | Rofougaran | |
| 2010/0277439 A1 | 11/2010 | Charlier et al. | |
| 2010/0295780 A1 | 11/2010 | Vaisanen et al. | |
| 2010/0295781 A1 | 11/2010 | Alameh et al. | |
| 2011/0007021 A1 | 1/2011 | Bernstein et al. | |
| 2011/0025619 A1 | 2/2011 | Joguet et al. | |
| 2011/0037709 A1 | 2/2011 | Cottarel et al. | |
| 2011/0061947 A1 | 3/2011 | Krah et al. | |
| 2011/0074701 A1 | 3/2011 | Dickinson et al. | |
| 2011/0096033 A1 | 4/2011 | Ko | |
| 2011/0109577 A1 | 5/2011 | Lee et al. | |
| 2011/0141009 A1 | 6/2011 | Izumi | |
| 2011/0163992 A1 * | 7/2011 | Cordeiro | G06F 3/0416 345/174 |
| 2011/0242037 A1 | 10/2011 | Gruber | |
| 2011/0254822 A1 | 10/2011 | Tsuchikawa et al. | |
| 2011/0267265 A1 | 11/2011 | Stinson | |
| 2011/0267280 A1 | 11/2011 | De Mers et al. | |
| 2011/0285657 A1 | 11/2011 | Shimotani et al. | |
| 2012/0050181 A1 | 3/2012 | King et al. | |
| 2012/0057064 A1 | 3/2012 | Gardiner et al. | |
| 2012/0084691 A1 | 4/2012 | Yun | |
| 2012/0105324 A1 | 5/2012 | Lee et al. | |
| 2012/0173067 A1 | 7/2012 | Szczerba et al. | |
| 2012/0174004 A1 | 7/2012 | Seder et al. | |
| 2012/0206333 A1 | 8/2012 | Kim | |
| 2012/0299848 A1 | 11/2012 | Homma et al. | |
| 2012/0299849 A1 | 11/2012 | Homma et al. | |

(56) References Cited

U.S. PATENT DOCUMENTS

| | | | |
|---|---|---|---|
| 2012/0313880 | A1 | 12/2012 | Geaghan et al. |
| 2012/0320247 | A1 | 12/2012 | Kim et al. |
| 2012/0326994 | A1 | 12/2012 | Miyazawa et al. |
| 2013/0002551 | A1 | 1/2013 | Imoto et al. |
| 2014/0028557 | A1 | 1/2014 | Otake et al. |
| 2014/0085202 | A1 | 3/2014 | Hamalainen et al. |
| 2014/0267176 | A1 | 9/2014 | Bathiche et al. |
| 2014/0285418 | A1 | 9/2014 | Adachi |
| 2015/0109257 | A1 | 4/2015 | Jalali |

FOREIGN PATENT DOCUMENTS

| | | |
|---|---|---|
| WO | WO2009/008568 A1 | 1/2009 |
| WO | WO2009/021836 A1 | 2/2009 |

OTHER PUBLICATIONS

Harrison, et al., "Abracadabra: Wireless, High-Precision, and Unpowered Finger Input for Very Small Mobile Devices", In Proceedings of the 22nd Annual ACM Symposium on User interface Software and Technology (Victoria, British Columbia, Canada, Oct. 4-7, 2009). UIST '09. ACM, New York, NY, 4 pages.

Office action for U.S. Appl. No. 12/846,328, mailed on Dec. 24, 2012, Rosenberg et al., "Two-Sided Touch Sensor", 15 pages.

Non-Final Office Action for U.S. Appl. No. 12/846,368, mailed on Feb. 15, 2013, Ilya D. Rosenberg et al., "Touch Distinction", 23 pages.

Office Action for U.S. Appl. No. 12/846,539, mailed on Feb. 15, 2013, Ilya D. Rosenberg et al., "Magnetic Touch Discrimination", 20 pages.

Non-Final Office Action for U.S. Appl. No. 13/247,669, mailed on Feb. 1, 2013, Julien G. Beguin et al., "Interacting Through Noncontact Gestures", 22 pages.

Office action for U.S. Appl. No. 12/846,519, mailed on Apr. 24, 2013, Rosenberg et al., "Touch Sensing Techniques", 23 pages.

Office action for U.S. Appl. No. 12/846,295, mailed on May 21, 2013, Rosenberg et al., "Visually Consistent Arrays", 14 pages.

Office action for U.S. Appl. No. 12/846,268, mailed on May 3, 2013, Rosenberg et al., "Gestures and Touches on Force-sensitive Input Devices", 15 pages.

Office action for U.S. Appl. No. 13/247,699, mailed on Jul. 19, 2013, Beguin et al., "Interacting Through Noncontact Gestures", 32 pages.

Final Office Action for U.S. Appl. No. 12/846,539, mailed on Oct. 25, 2013, Ilya D. Rosenberg, "Magnetic Touch Discrimination", 26 pages.

Office Action for U.S. Appl. No. 12/846,268, mailed on Oct. 23, 2013, Ilya D. Rosenberg, "Gestures and Touches on Force-sensitive Input Devices", 37 pages.

Office Action for U.S. Appl. No. 12/846,428, mailed on Oct. 9, 2013, Ilya D. Rosenberg, "Hardware Enabled Interpolating Sensor and Display", 25 pages.

Office action for U.S. Appl. No. 12/846,519, mailed on Nov. 14, 2013, Rosenberg, et al., "Touch Sensing Techniques", 24 pages.

Office action for U.S. Appl. No. 12/846,328, mailed on Aug. 15, 2013, Rosenberg et al., "Two-Sided Touch Sensor", 18 pages.

Office action for U.S. Appl. No. 12/846,368, mailed on Sep. 13, 2013,Rosenberg et al., "Touch Distinction", 36 pages.

Wolf, et al., "Angles, Azimuths, and Bearings", Pearson Prentice Hall, Elementary Surveying, 12th Edition, 2008, Chapter 7, pp. 165-184.

Office action for U.S. Appl. No. 12/846,428, mailed on Feb. 21, 2014, Rosenberg, et al., "Hardware Enabled Interpolating Sensor and Display", 30 pages.

Final Office Action for U.S. Appl. No. 12/846,295, mailed on Dec. 23, 2013, Ilya D. Rosenberg, "Visually Consistent Arrays including Conductive Mesh", 16 pages.

Office Action for U.S. Appl. No. 13/247,699, mailed on Jan. 31, 2014, Julien G. Beguin, "Interacting Through Noncontact Gestures", 28 pages.

Office Action for U.S. Appl. No. 12/846,328, mailed on Dec. 19, 2013, Ilya D. Rosenberg, "Two-Sided Touch Sensor", 13 pages.

Final Office Action for U.S. Appl. No. 12/846,368, mailed on Feb. 27, 2015, Ilya D. Rosenbert, "Touch Distinction", 49 pages.

Office action for U.S. Appl. No. 13/247,699, mailed on Aug. 27, 2015, Beguin et al., "Interacting Through Noncontact Gestures", 24 pages.

Final Office Action for U.S. Appl. No. 12/846,428, mailed on Dec. 1, 2014, Ilya D. Rosenberg, "Hardware Enabled Interpolating Sensor and Display", 26 pages.

Office Action for U.S. Appl. No. 12/846,268, mailed on Dec. 22, 2014, Ilya D. Rosenberg, "Gestures and Touches on Force-sensitive Input Devices", 36 pages.

Office Action for U.S. Appl. No. 12/846,539, mailed on Feb. 24, 2015, Ilya D. Rosenberg, "Magnetic Touch Discrimination", 17 pages.

Office Action for U.S. Appl. No. 12/846,519, mailed on Mar. 11, 2015, Ilya D. Rosenberg, "Touch Sensing Techniques", 35 pages.

Final Office Action for U.S. Appl. No. 12/846,268, mailed on Apr. 2, 2015, Ilya D. Rosenberg, "Gestures and Touches on Force-sensitive Input Devices", 37 pages.

Office action for U.S. Appl. No. 12/846,519 mailed on Nov. 18, 2015, Rosenberg et al., "Touch Sensing Techniques", 36 pages.

Office action for U.S. Appl. No. 13/247,699, mailed on Mar. 24, 2016, Beguin et al., "Interacting Through Noncontact Gestures", 25 pages.

Office action for U.S. Appl. No. 12/846,368, mailed on Apr. 21, 2016, Rosenberg et al., "Touch Distinction", 24 pages.

Office action for U.S. Appl. No. 12/846,368, mailed on Oct. 18, 2016, Rosenberg et al., "Touch Distinction", 21 pages.

Office action for U.S. Appl. No. 15/003,086, mailed on Dec. 15, 2016, Rosenberg et al., "Gestures and Touches on Force-sensitive Input Devices", 23 pages.

Office action for U.S. Appl. No. 15/003,086, mailed on Jun. 17, 2016, Rosenberg et al., "Gestures and Touches on Force-sensitive Input Devices", 11 pages.

Office Action for U.S. Appl. No. 12/846,268, mailed on Jul. 29, 2010, Ilya D. Rosenberg, "Gestures and Touches on Force-sensitive Input Devices", 32 pages.

Office action for U.S. Appl. No. 12/846,368, mailed on Jul. 17, 2014, Rosenberg et al., "Touch Distinction", 45 pages.

Office Action for U.S. Appl. No. 12/846,428, mailed on Aug. 21, 2014, Ilya D. Rosenberg, "Hardware Enabled Interpolating Sensor and Display", 24 pages.

Office action for U.S. Appl. No. 12/846,295, mailed on Sep. 24, 2014, Rosenberg et al., "Visually Consistent Arrays including Conductive Mesh", 17 pages.

Final Office Action for U.S. Appl. No. 13/247,699, mailed on Sep. 26, 2014, Julien G. Beguin, "Interacting Through Noncontact Gestures", 30 pages.

Office action for U.S. Appl. No. 15/003,086, dated Apr. 4, 2017. Rosenberg et al., "Gestures and Touches on Force-sensitive Input Devices", 24 pages.

Moscovich, et al., "Multi-finger Cursor Techniques", Department of Computer Science, Brown University, Year of Publication: 2006, 7 pages.

Office action for U.S. Appl. No. 12/846,368, dated Sep. 10, 2015, Rosenberg et al., "Touch Distinction", 20 pages.

\* cited by examiner

CAPACITIVE SENSING WITH INTERPOLATING FORCE-SENSITIVE RESISTOR ARRAY

PRIORITY

The present application claims priority to U.S. Provisional Application Ser. No. 61/230,592, filed on Jul. 31, 2009, entitled "Inventions Related to Touch Screen Technology" and U.S. application Ser. No. 12/380,350, filed on Feb. 26, 2009, entitled "Method and apparatus for providing input to a processor, and a sensor pad." These pending applications are hereby incorporated by reference in their entirety, and the benefit of the filing dates of these pending applications are claimed to the fullest extent permitted.

BACKGROUND

Electronic devices are ubiquitous, and include cellular phones, eBook readers, tablet computers, desktop computers, portable media devices, and so forth. These electronic devices may utilize touch sensors for accepting user input.

BRIEF DESCRIPTION OF THE DRAWINGS

The detailed description is set forth with reference to the accompanying figures. In the figures, the left-most digit(s) of a reference number identifies the figure in which the reference number first appears. The use of the same reference numbers in different figures indicates similar or identical items.

DETAILED DESCRIPTION

Overview

Figure 1:
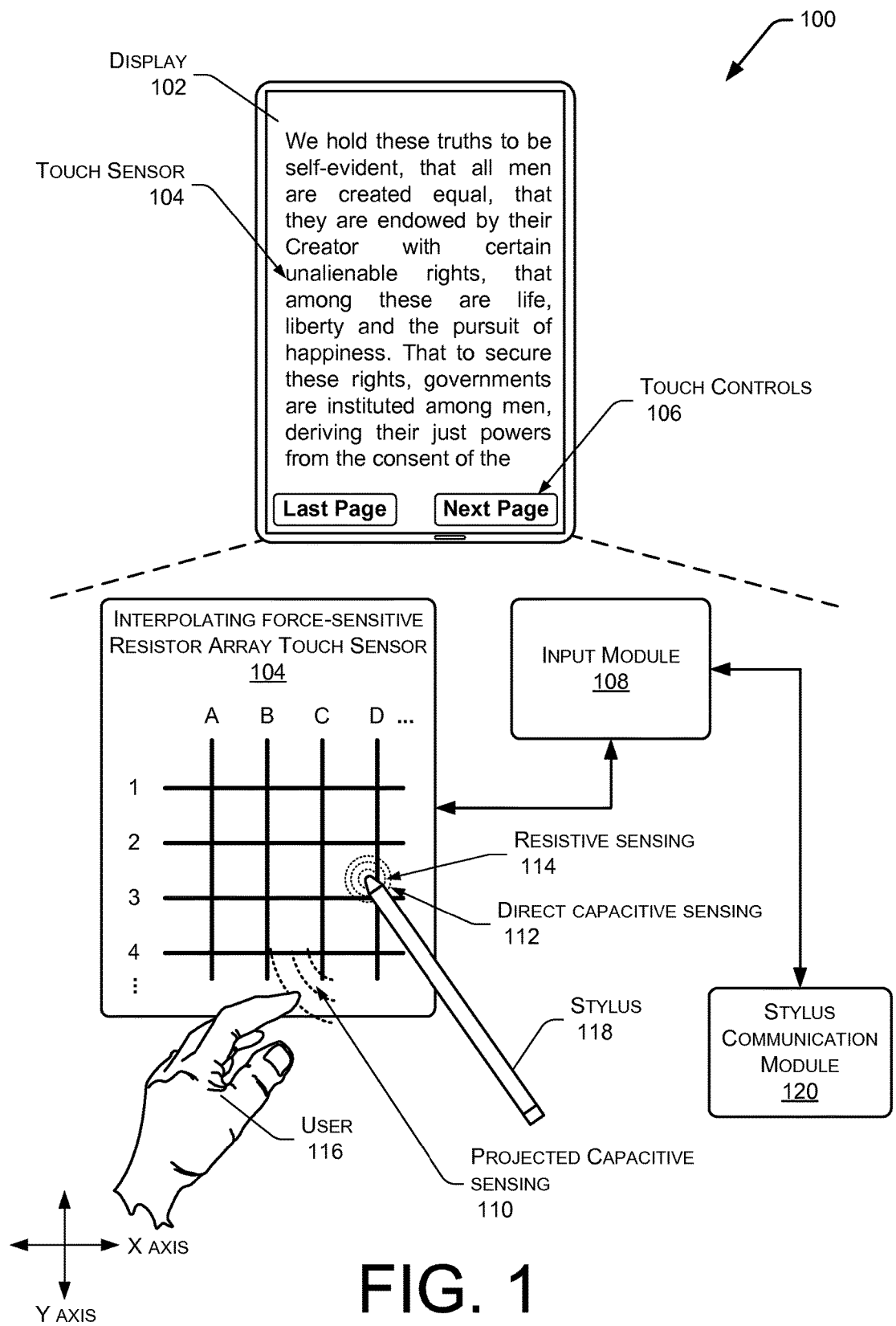
FIG. 1 depicts an electronic device configured with an interpolating force-sensitive resistor (IFSR) array touch sensor configured to sense touches resistively and capacitively, or by way of an active stylus.

Described herein are techniques and apparatus for characterizing touches based upon resistive and capacitive input. A resistive sensor providing resistive input may be coupled to a capacitive touch sensor providing capacitive touch input. As used in this disclosure for illustration, and not by way of limitation, the resistive sensor may comprise an interpolating force-sensitive resistor (IFSR) array touch sensor. In another implementation, the (IFSR) array touch sensor may be configured to detect touches resistively as well as capacitively.

By utilizing resistive and capacitive input and analyzing and comparing the two, it becomes possible to detect near-touches, detect light touches, accurately characterize touches, and so forth. Furthermore, the IFSR array allows for measuring the pressure exerted by a touch on the sensor. Additionally, the IFSR array may also be used in conjunction with an active stylus to determine a position of the active stylus relative to the IFSR array.

An IFSR array comprises two layers. A first layer incorporates columns of electrodes and a second layer comprises rows of electrodes. These layers are disposed generally perpendicular to one another, such that a grid pattern is formed. A resistive material fills gaps between the electrodes within the layers and acts as a linear resistor. When a user pushes upon the array, the resistance at various intersections between the rows and columns changes. Because of the linear responsiveness of the resistive material, it is possible for a touch controller to interpolate the location of a touch between intersections. Additionally, a magnitude of the applied force is discernable as well.

Because the first and second layers are not directly in contact, direct capacitive effects are present as well. In some implementations projected capacitive effects may present instead of, or in addition to, direct capacitive effects. The resistive material, air, or other materials within the sensor act as a dielectric for the capacitor. When a charge is applied to a portion of one layer, such as a particular row, capacitive coupling introduces a charge within overlapping columns. As described herein, this may be utilized to provide for touch and hovering (near-touch) detection. Furthermore, because the degree of capacitive coupling varies depending upon the composition of material, the capacitive effect may be utilized to characterize the material which is impinging the touch. For example, a human finger provides a greater capacitive coupling effect than an inanimate plastic or ceramic stylus.

Resistive and capacitive effects within a single sensor are discernable in a time domain of a signal generated by the IFSR array. These effects may vary based upon the physical implementation of the IFSR array. In one implementation, capacitive effects result in a brief voltage spike shortly after pulsing the electrodes, whereas resistive effects result in a generally steady state voltage over a longer time span. A timeframe of these effects may be short, such as on the order of microsecond.

The IFSR array may be configured to act in a capacitive mode only by placing a non-conductive layer between the first and second touch sensor layers. This implementation allows for the fabrication of an inexpensive capacitive sensor. Furthermore, this configuration may also be used in conjunction with the active stylus describe below.

In some implementations, the IFSR array operating in resistive mode may be coupled with a discrete capacitive touch sensor. The two sensors may be arranged such that they are adjacent to and coincident with each other, such as one behind another. In another implementation, the two sensors may be distributed in an alternating row, grid, or other pattern such that they are side-by side. Output signals from both touch sensors may be compared to provide the characterization capabilities described above. For example, a touch which is detected by the IFSR array but not by the capacitive sensor may be characterized as a stylus touch.

The IFSR array may also be used in conjunction with an active stylus. The active stylus contains electronics which allow it to interact with the IFSR touch sensor array. In one implementation, a signal may be generated by the touch sensor, which is then received by the active stylus. Position of the active stylus may be determined by comparing the received signal with a known scan pattern, timing, modulation of the signal, and so forth. In other implementations, the active stylus may generate the signal which is received by the IFSR array which determines the position. The IFSR array may continue to operate in resistive, capacitive, or both modes while using the active stylus.

Illustrative Device

FIG. 1 depicts an electronic device 100 configured with an interpolating force-sensitive resistor (IFSR) array touch sensor. A display 102 is depicted, which is configured to present information (e.g., a portion of an eBook) to a user. The display 102 may include an electrophoretic display, liquid crystal display, and so forth as discussed in more depth below with regards to FIG. 2 below. An IFSR array touch sensor 104 (or simply "touch sensor" herein) accepts input from a user. In some implementations, such as shown here, the display 102 and the touch sensor 104 may be combined to provide a touch-sensitive display, or touchscreen display. In such an arrangement, the touch sensor 104 component may be disposed behind the display 102 component, or vice versa. Also shown on the display 102 and coincident with active areas on the touch sensor 104 are touch control buttons 106 configured to allow the user to move to a previous/last page and a next page.

The device 100 incorporates an input module 108 which processes input from the touch sensor 104 to characterize touches. Characterization of the touches may include distinction of composition, location, force, area, duration, and so forth.

The touch sensor 104 may be configured to operate in several modes: projected capacitive sensing 110, direct capacitive sensing 112, resistive sensing 114, or a combination thereof. These modes may be used individually or combined in the same touch sequence. For the following discussion, it is useful to consider the approach and eventual contact of a user's 116 finger or hand to the touch sensor 104.

The projected capacitive sensing 110 mode provides for sensing an object which is not in contact with the touch sensor, or hovering, proximate to the touch sensor. For example, as the user's 116 finger approaches the touch sensor 104, the capacitive sensing 110 detects the finger without contact to the surface of the touch sensor 104 at all. Upon approach to the surface, the user's finger 116 distorts an electric field at a junction of rows and columns due to capacitive coupling, and results in a detectable signal which may be interpreted as a touch. The user may thus hover, or place the finger proximate to, but not in contact with, the touch sensor 104.

As the user 116 continues to move the finger towards the touch sensor, it may eventually lightly contact the touch sensor 104 surface. While operating in direct capacitive sensing 112 mode, very light touches will register a touch. These very light touches may be so slight as to result be imperceptible to the user 116, but result in deformation or compression of the touch sensor layers which affects capacitance between the components therein. A slightly harder push will result in increased changes to the direct capacitance until reaching a threshold level at which point increasing pressure no longer results in a change in output signal.

As the user 116 continues to press harder, resistive sensing due to the physical deformation or compression of the touch sensor 104 layers may predominate. While the direct capacitive effects reach a threshold level, the resistive material continues to provide variation which is proportionate to the force applied. Thus, the harder the touch, the more the resistive changes in the material of the touch sensor 104.

A stylus 118 may also be used for input. In some implementations, the stylus 118 may include active components, forming an active stylus 1200 as discussed below with regards to FIGS. 12-15. This active stylus may communicate with the stylus communication module 120 to exchange information, allowing for the determination of the stylus position relative to the touch sensor 104.

Figure 2:
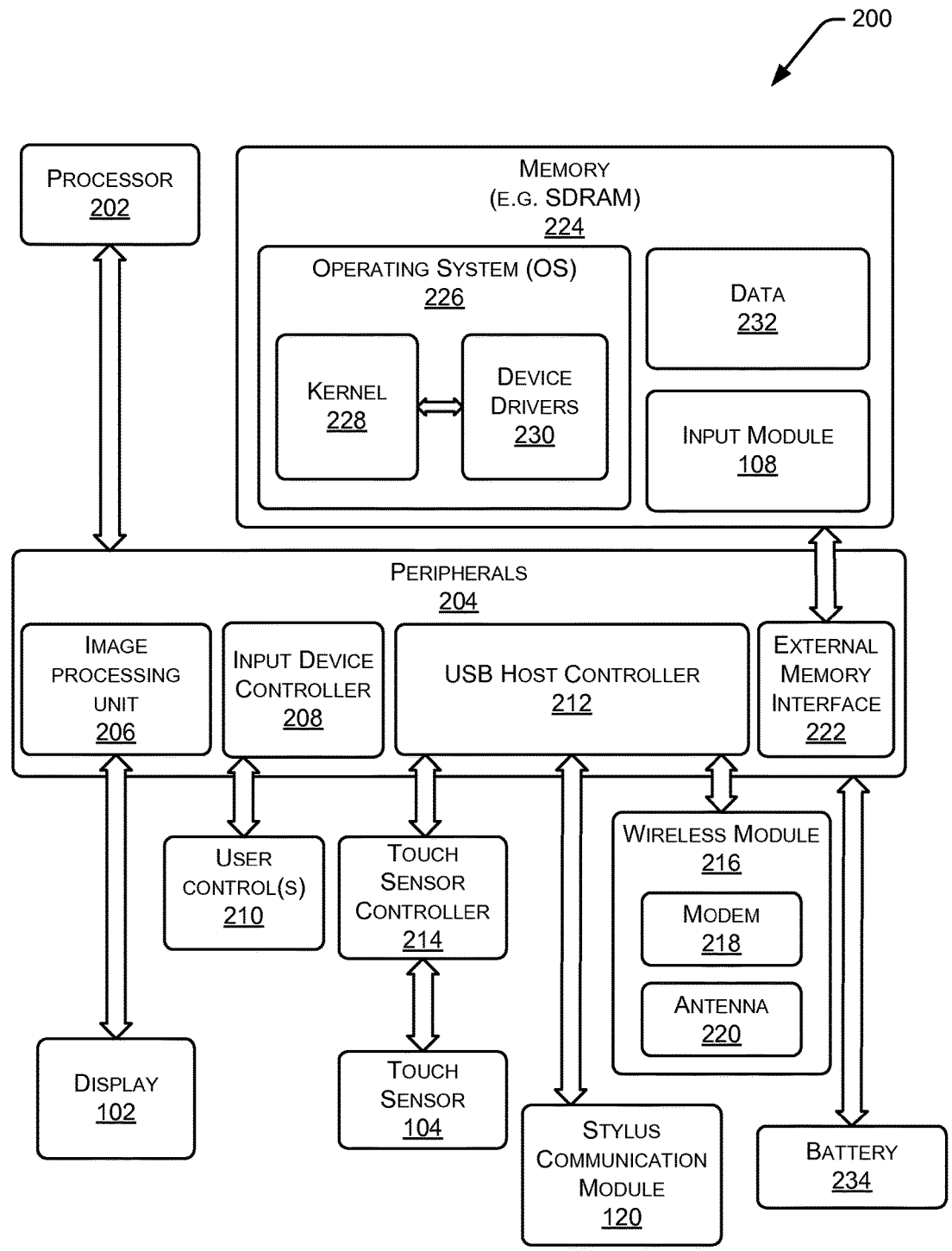
FIG. 2 is an illustrative schematic of the electronic device with an IFSR array touch sensor.

FIG. 2 is an illustrative schematic 200 of the electronic device 100 of FIG. 1. In a very basic configuration, the device 100 includes components such as a processor 202 and one or more peripherals 204. Each processor 202 may itself comprise one or more processors.

Peripherals 204 couple to the processor 202. An image processing unit 206 is shown coupled to one or more display components 102 (or "displays"). In some implementations, multiple displays may be present and coupled to the image processing unit 206. These multiple displays may be located in the same or different enclosures or panels. Furthermore, one or more image processing units 206 may couple to the multiple displays.

The display 102 may present content in a human-readable format to a user. The display 102 may be reflective, emissive, or a combination of both. Reflective displays utilize incident light and include electrophoretic displays, interferometric modulator displays, cholesteric displays, pre-printed materials, and so forth. Emissive displays do not rely on incident light and, instead, emit light. Emissive displays include backlit liquid crystal displays, time multiplexed optical shutter displays, light emitting diode displays, backlit pre-printed materials, and so forth. When multiple displays are present, these displays may be of the same or different types. For example, one display may be an electrophoretic display while another may be a liquid crystal display.

For convenience only, the display 102 is shown in a generally rectangular configuration. However, it is understood that the display 102 may be implemented in any shape, and may have any ratio of height to width. Also, for stylistic or design purposes, the display 102 may be curved or otherwise non-linearly shaped. Furthermore the display 102 may be flexible and configured to fold or roll.

The content presented on the display 106 may take the form of electronic books or "eBooks." For example, the display 106 may depict the text of the eBooks and also any illustrations, tables, or graphic elements that might be contained in the eBooks. The terms "book" and/or "eBook", as used herein, include electronic or digital representations of printed works, as well as digital content that may include text, multimedia, hypertext, and/or hypermedia. Examples of printed and/or digital works include, but are not limited to, books, magazines, newspapers, periodicals, journals, reference materials, telephone books, textbooks, anthologies, instruction manuals, proceedings of meetings, forms, directories, maps, web pages, and so forth. Accordingly, the terms "book" and/or "eBook" may include any readable or viewable content that is in electronic or digital form.

The device 100 may have an input device controller 208 configured to accept input from a keypad, keyboard, or other user actuable controls 210. These user actuable controls 210 may have dedicated or assigned operations. For instance, the actuatable controls may include page turning buttons, a navigational keys, a power on/off button, selection keys, joystick, touchpad, and so on.

The device 100 may also include a USB host controller 212. The USB host controller 212 manages communications between devices attached to a universal serial bus ("USB") and the processor 202 and other peripherals.

FIG. 2 further illustrates that the device 100 includes a touch sensor controller 214. The touch sensor controller 214 couples to the processor 202 via the USB host controller 212 (as shown). In other implementations, the touch sensor controller 214 may couple to the processor via the input device controller 208, inter-integrated circuit ("I$^2$C"), universal asynchronous receiver/transmitter ("UART"), or serial peripheral interface bus ("SPI"), or other interfaces. The touch sensor controller 214 couples to one or more of the touch sensors 104. The touch sensor 104 is configured such that user input through contact or gesturing relative to the device 100 may be received.

The touch sensor controller 214 is configured to determine characteristics of interaction with the touch sensor 104. These characteristics may include the location of the touch on the touch sensor 104, magnitude of the force, shape of the touch, and so forth.

The USB host controller 212 may also couple to a wireless module 216 via the universal serial bus. The wireless module 216 may allow for connection to wireless local or wireless wide area networks ("WWAN"). Wireless module 216 may include a modem 218 configured to send and receive data wirelessly and one or more antennas 220 suitable for propagating a wireless signal. In other implementations, the device 100 may include a wired network interface.

The device 100 may also include an external memory interface ("EMI") 222 coupled to external memory 224. The EMI 222 manages access to data stored in external memory 224. The external memory 224 may comprise Static Random Access Memory ("SRAM"), Pseudostatic Random Access Memory ("PSRAM"), Synchronous Dynamic Random Access Memory ("SDRAM"), Two Data Rate SDRAM ("DDR"), Phase-Change RAM ("PCRAM"), or other computer-readable storage media.

The external memory 224 may store an operating system 226 comprising a kernel 228 operatively coupled to one or more device drivers 230. The device drivers 230 are also operatively coupled to peripherals 204, such as the touch sensor controller 214. The external memory 224 may also store data 232, which may comprise content objects for consumption on eBook reader device 100, executable programs, databases, user settings, configuration files, device status, the input module 108, and so forth.

One or more batteries 234 provide operational electrical power to components of the device 100 for operation when the device is disconnected from an external power supply. The device 100 may also include one or more other, non-illustrated peripherals, such as a hard drive using magnetic, optical, or solid state storage to store information, a firewire bus, a Bluetooth™ wireless network interface, camera, global positioning system, PC Card component, and so forth.

Couplings, such as that between the touch sensor controller 214 and the USB host controller 212, are shown for emphasis. There are couplings between many of the components illustrated in FIG. 2, but graphical arrows are omitted for clarity of illustration.

Resistive and Capacitive Sensing with an IFSR Array

Figure 3:
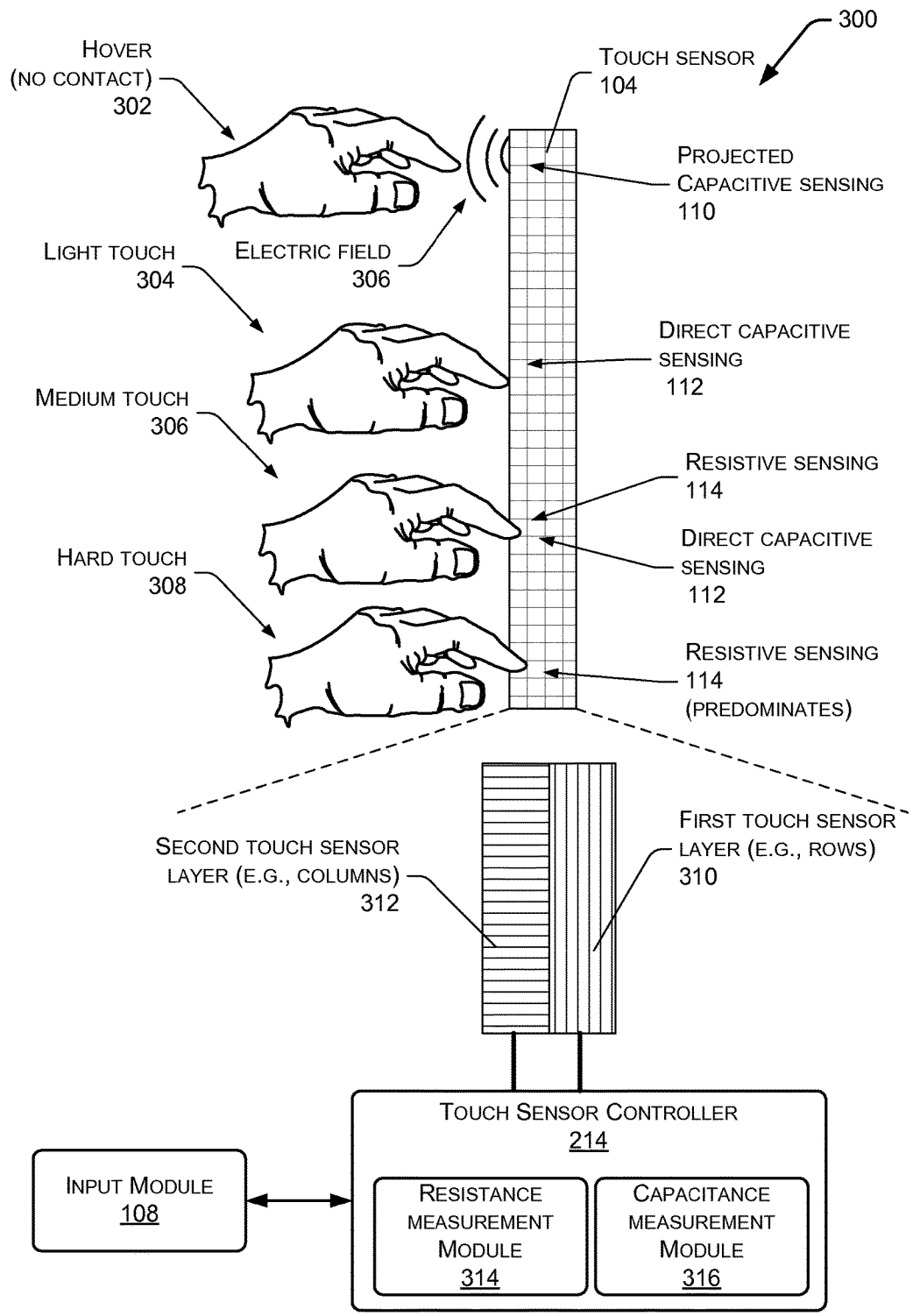
FIG. 3 is a cross-sectional illustration of an IFSR array touch sensor.

FIG. 3 is a cross-sectional illustration 300 of an IFSR array touch sensor demonstrating different modes of sensing touches. As shown here, consider the user 116 moving their hand to approach the touch sensor 104.

As shown at 302, prior to contact the hand "hovers" over the surface of the touch sensor 104, and may be sensed via projected capacitive sensing 110.

As the hand comes lightly in contact as shown at 304, the slight (and perhaps imperceptible to the user) deformation or compression of the touch sensor 104 results in direct capacitive sensing 112. In some implementations, capacitive sensing (both projected and/or direct) reaches a threshold output level at about 50 grams of applied force. The touch may also indicated by projected capacitive sensing 110, which may vary depending upon increasing contact area where the touch is generated by a deformable object, such as a fingertip.

As the user presses harder, as shown at 306 the resistive mode begins to generate a signal which is proportional to the amount of force applied. In some implementations, the resistive sensing begins to output a signal at about 20 grams of applied force, which then increases proportionately as the applied force increases. Thus, medium touches are sensed both by the direct capacitive sensing 112 and projected capacitive sensing 110 as well as resistive sensing 114.

As the pressure of the touch by the user 116 continues to increase as shown at 308, the resistive sensing 114 mode predominates. Signals from the projected capacitive sensing 110 and the direct capacitive sensing 112 modes have reached stable levels, unlike the resistive sensing 114 mode which continues to vary providing input as to how hard the touch is. As a result, the resistive mode 114 allows for continued determination of magnitude of the applied force.

Also shown in FIG. 3 is an enlargement is a multi-layer embodiment of the touch sensor 104. A first touch sensor layer 310 may include, for example, elements such as rows of electrodes. Adjacent to and coincident with the first touch sensor layer 310 is a second touch sensor layer 312, which may include, for example, elements such as columns of electrodes. The multi-layer touch sensor 104 is coupled to the touch sensor controller 214. The touch sensor controller 214 may include a resistance measurement module 314 configured to measure resistance across one or more intersections of rows and columns of electrodes. The touch sensor controller 214 may further include a capacitance measurement module 316 configured to measure direct capacitance across one or more intersections of rows and columns of electrodes, projected capacitance from these intersections, and so forth.

The touch sensor controller 214 scans the touch sensor 104. The resistance measurement module 314 quantifies any resistive readings from the sensor 104 while the capacitance measurement module 316 quantifies any capacitance readings. The touch sensor controller 214 generates touch data based on the measurements of modules 314 and 316 and the touch data is sent to the input module 108. The input module 108 may then characterize touches, initiate actions based upon the touches, and so forth.

Figure 4:
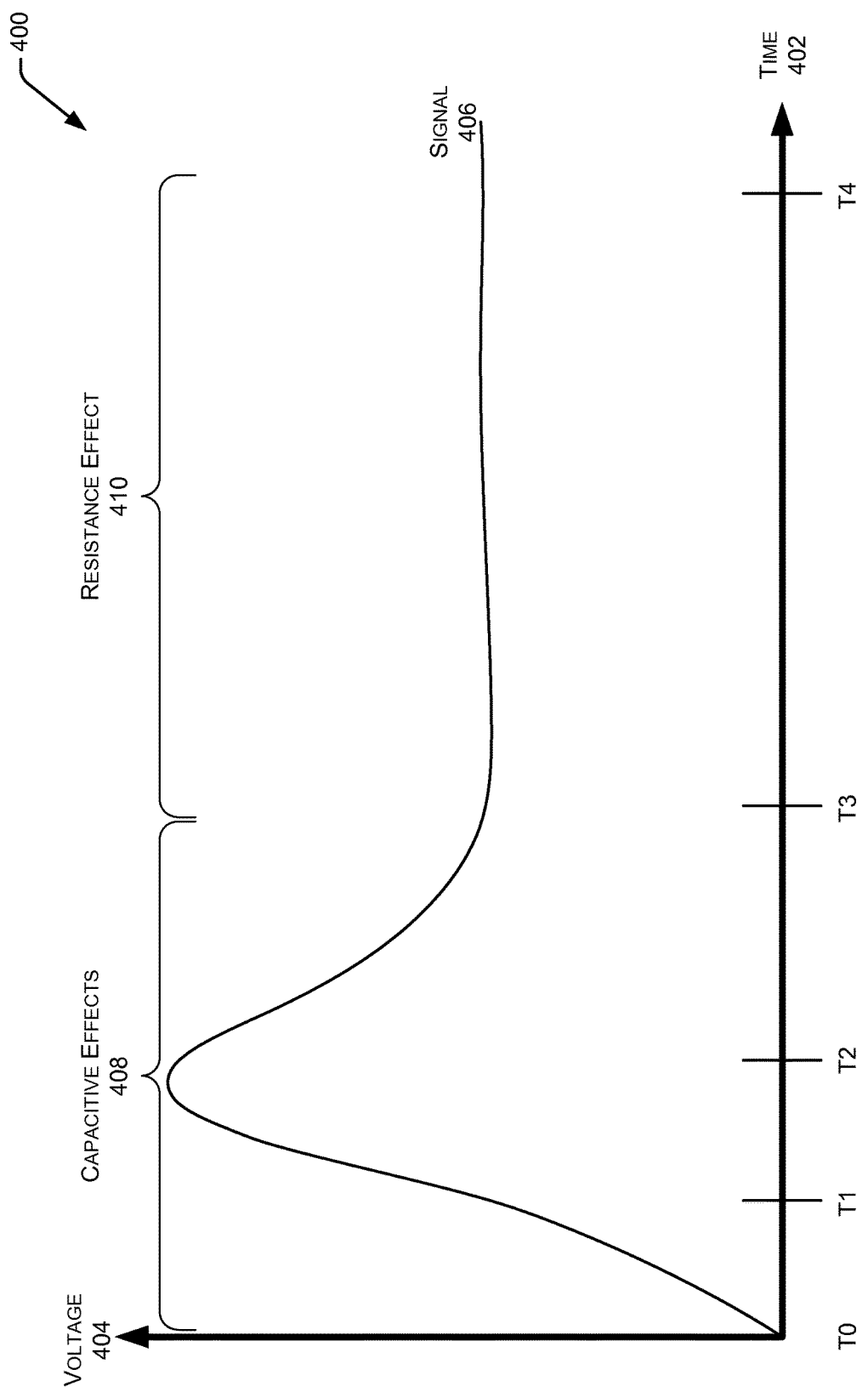
FIG. 4 illustrates a temporal voltage profile associated with the IFSR array touch sensor depicting capacitive and resistive effects.

FIG. 4 illustrates a temporal voltage profile 400 associated with the IFSR array touch sensor 104 depicting capacitive and resistive effects. As mentioned above, resistive and capacitive effects are discernable in a time domain of a signal generated by the IFSR array 104. These effects may vary based upon the physical implementation of the IFSR array 104. The curve depicted in the temporal voltage profile 400 is provided by way of illustration, and not limitation.

In this figure, the X axis indicates increasing time 402, while the perpendicular Y axis indicates voltage 404 measured by the touch sensor controller 214. A signal 406 is shown plotted on the X-Y graph. The signal 406 is received by the touch sensor controller 214 during or after pulsing on or more electrodes in the touch sensor 104. Beginning at time T0, a user approaches and touches the touch sensor 104 with contact occurring at T1. As the touch nears the surface, the signal shows an increase in signal between times T0 and T1 owing to projected capacitive sensing 116. As the touch continues between times T1 and T2 the user increases force, presenting a light touch which results in direct capacitive effects which further increase the signal to a peak at T2. A capacitive effect 408 is thus reflected as a voltage spike in the time domain of the signal. At time T3, the user is in contact with and depressing on the touch sensor 104. The capacitive effects 408 have tapered off and the resistance effect 410 predominate, as characterized by a steady state voltage from time T3 to T4 representing a touch with relatively constant applied force. The magnitude of this voltage may be proportionate to the magnitude of an applied force. For example, a harder press may result in a greater steady state voltage.

The time scale may vary depending upon the electrical characteristics of the components involved. In one implementation, the timeframe of these effects may such that the capacitive effect 408 has a duration on the order of microseconds.

Figure 5:
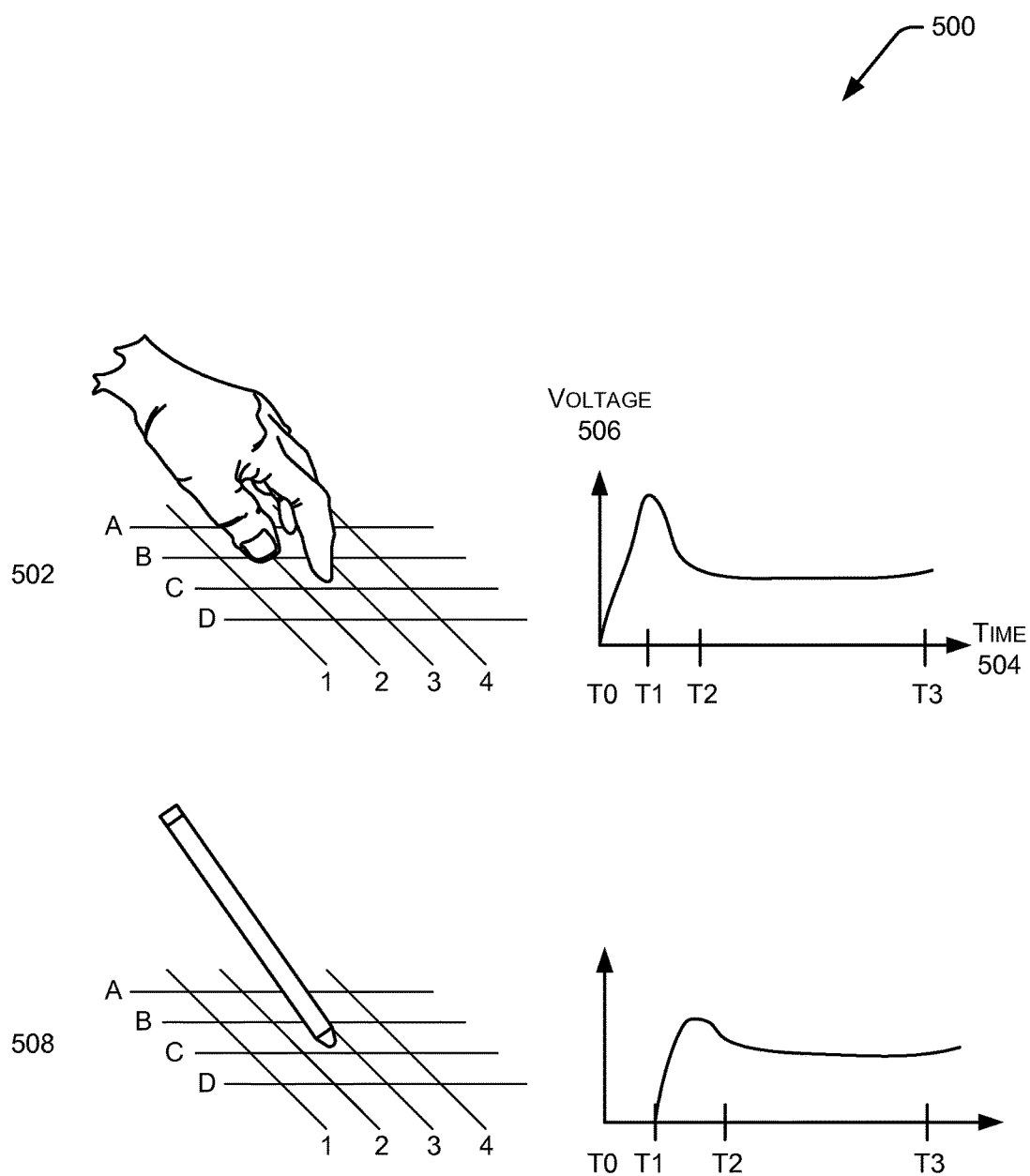
FIG. 5 illustrates the temporal voltage profiles of a finger touch compared to a non-finger, or stylus, touch.

FIG. 5 illustrates the temporal voltage profiles 500 of a finger touch compared to a non-finger, or stylus, touch where the single sensor detects resistive and capacitive effects. At 502, a finger is shown touching the touch sensor 104. A chart showing time 504 versus voltage 506 exhibits the corresponding temporal voltage profile with a voltage spike corresponding to the capacitive effects described above with respect to FIG. 4. The projected capacitive sensing 110 occurs prior to touch at times T0 to T1, direct capacitive sensing 112 occurs from T1 to T2, and resistive sensing 114 predominates between T2 and T3.

In comparison, at 508, a stylus is used to touch the touch sensor 104, rather than a human finger. The corresponding temporal voltage profile shows no signal from time T0 to time T1 due to the lack of projected capacitive coupling to the stylus. When the stylus contacts the surface at T1, the direct capacitive sensing 112 begins to produce a signal, and the resistive sensing 114 predominates from time T2 to T3. As a result of this difference, touches may be characterized. For example, as shown here it is possible to distinguish a touch from a finger which capacitively couples with elements within the sensor via projected capacitance and a touch from an inanimate stylus which does not provide capacitive coupling via projected capacitance sufficient to generate a signal.

As described above, the temporal voltage profile incorporates characteristics resulting from resistive and capacitive effects detected by the touch sensor 104. The following processes may be used to generate the temporal voltage profile and analyze the profile to characterize a touch.

Figure 6:
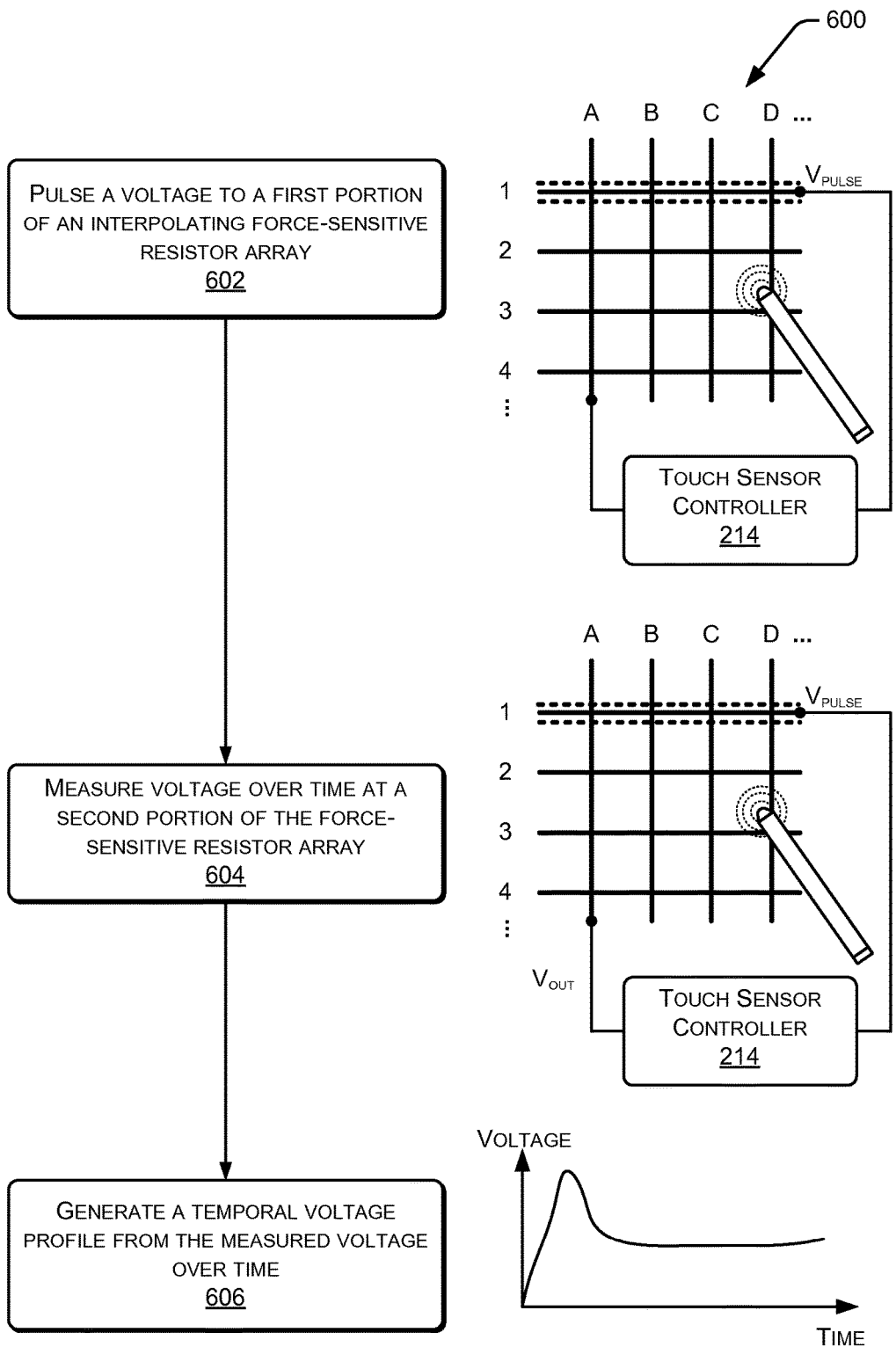
FIG. 6 is an illustrative process of generating a temporal voltage profile of a touch obtained by the IFSR touch sensor array.

FIG. 6 is an illustrative process 600 of generating a temporal voltage profile of a touch obtained by the IFSR touch sensor array. This process, and others described in this disclosure may be implemented by the architectures described in this disclosure, or by other architectures. These processes described in this disclosure are illustrated as a collection of blocks in a logical flow graph, which represent a sequence of operations that can be implemented in hardware, software, or a combination thereof. In the context of software, the blocks represent computer-executable instructions that may be stored on one or more computer-readable storage media and that, when executed by one or more processors, perform the recited operations. Generally, computer-executable instructions include routines, programs, objects, components, data structures, and the like that perform particular functions or implement particular abstract data types. The order in which the operations are described is not intended to be construed as a limitation, and any number of the described blocks can be combined in any order or in parallel to implement the processes.

At 602, the touch sensor controller 214 pulses a voltage to a first portion of an interpolating force-sensitive resistor array. As shown here, this array may comprise a set of rows and columns which together form an addressable array of junctions. For example, a pulse having voltage $V_{pulse}$ may be made to row number 1 in the IFSR array 104. At 604, the touch sensor controller 214 measures voltage $V_{out}$ over time at a second portion of the IFSR array. For example, the touch sensor controller 214 may measure voltage on column A.

At 606, the touch sensor controller 214 generates a temporal voltage profile 400 from the measured voltage over time which corresponds to a selected junction of the touch sensor 104. Continuing the above example, the resulting temporal voltage profile 400 thus corresponds to the intersection of row 1 and column A. As described above with regards to FIGS. 4-5, this temporal voltage profile contains information about capacitive and resistive effects resulting from a touch or a near-touch. In some implementations, the input module 108 may generate the temporal voltage profile 400 based on data provided by the touch sensor controller 214.

Figure 7:
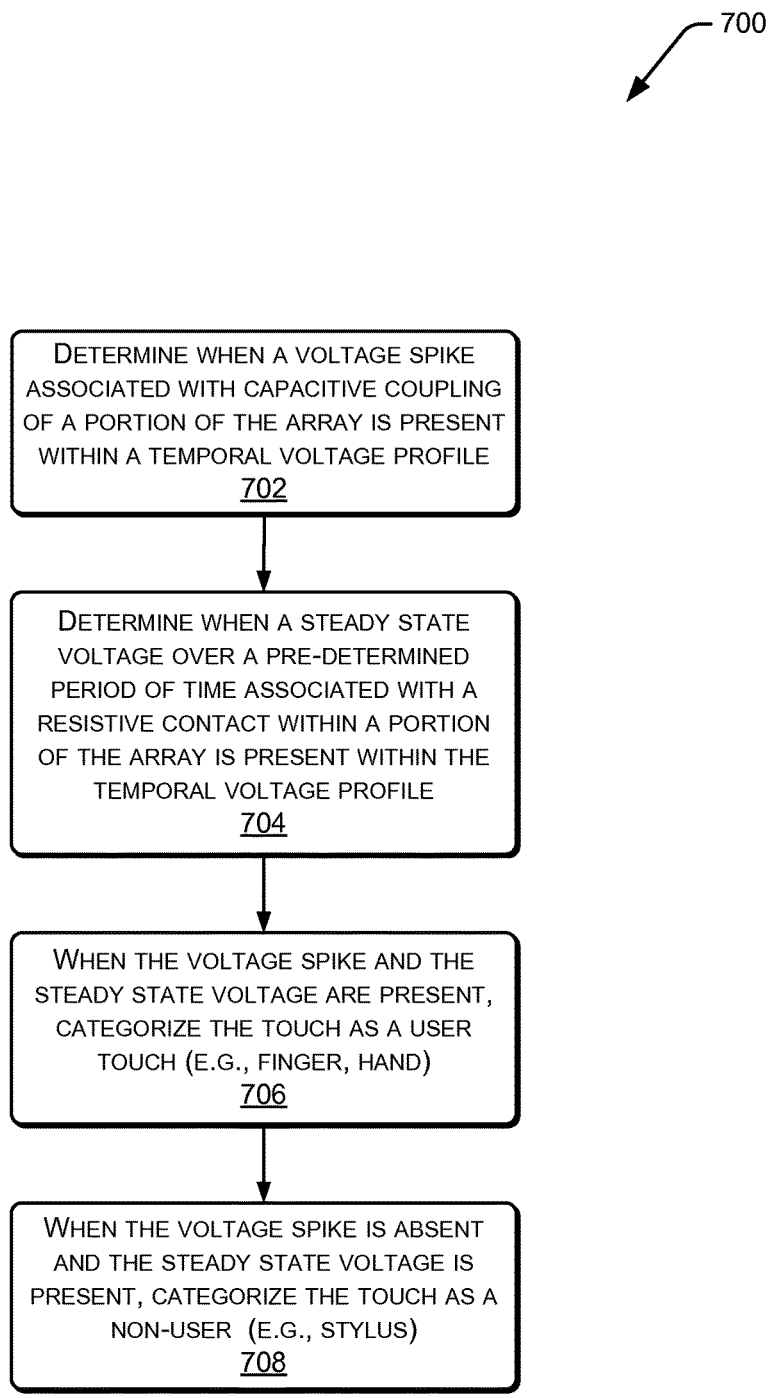
FIG. 7 is an illustrative process of characterizing a touch based at least in part on a temporal voltage profile obtained by the IFSR touch sensor array.

FIG. 7 is an illustrative process 700 of characterizing a touch based at least in part on the temporal voltage profile 400 obtained by the IFSR touch sensor array. As described above with respect to FIG. 6, the temporal voltage profile 400 may be obtained during scanning of the touch sensor 104. Because different objects may capacitively couple to the touch sensor 104 to different degrees, it is possible to combine the resistive and capacitive touch sensor 104 data to characterize the touch.

At 702, the input module 108 determines when a voltage spike associated with a capacitive coupling of a portion of the array is present within the temporal voltage profile 400. For example, this may occur when a finger capacitively couples with a junction within the touch sensor 104, altering the capacitance of the junction.

At 704, the input module 108 determines when a steady state voltage over a pre-determined period of time associated with a resistive contact within a portion of the array is present within the temporal voltage profile. For example, as described above, the physical distortion of the touch sensor which results in the resistive sensing 114 has a duration greater than the capacitive effect. The pre-determined period of time may be static, such as 300 microseconds, or dynamically adjusted.

At 706, when the voltage spike and the steady state voltage are present, the input module 108 categorizes the touch as a user touch. The user touch may comprise a finger, palm, knuckle, cheek, and so forth.

At 708, when the voltage spike is absent and the steady state voltage is present, the input module 108 categorizes the touch as a non-user touch. The non-user touch may comprise a stylus or other inanimate object. Thus, inanimate objects which do not generate appreciable capacitive coupling are distinguished.

IFSR Array Configured for Capacitive Sensing

In some implementations, it may be desirable for the IFSR touch sensor array 104 to be configured to operate in a capacitive mode only. There are various ways to accomplish this, and one implementation is described next.

Figure 8:
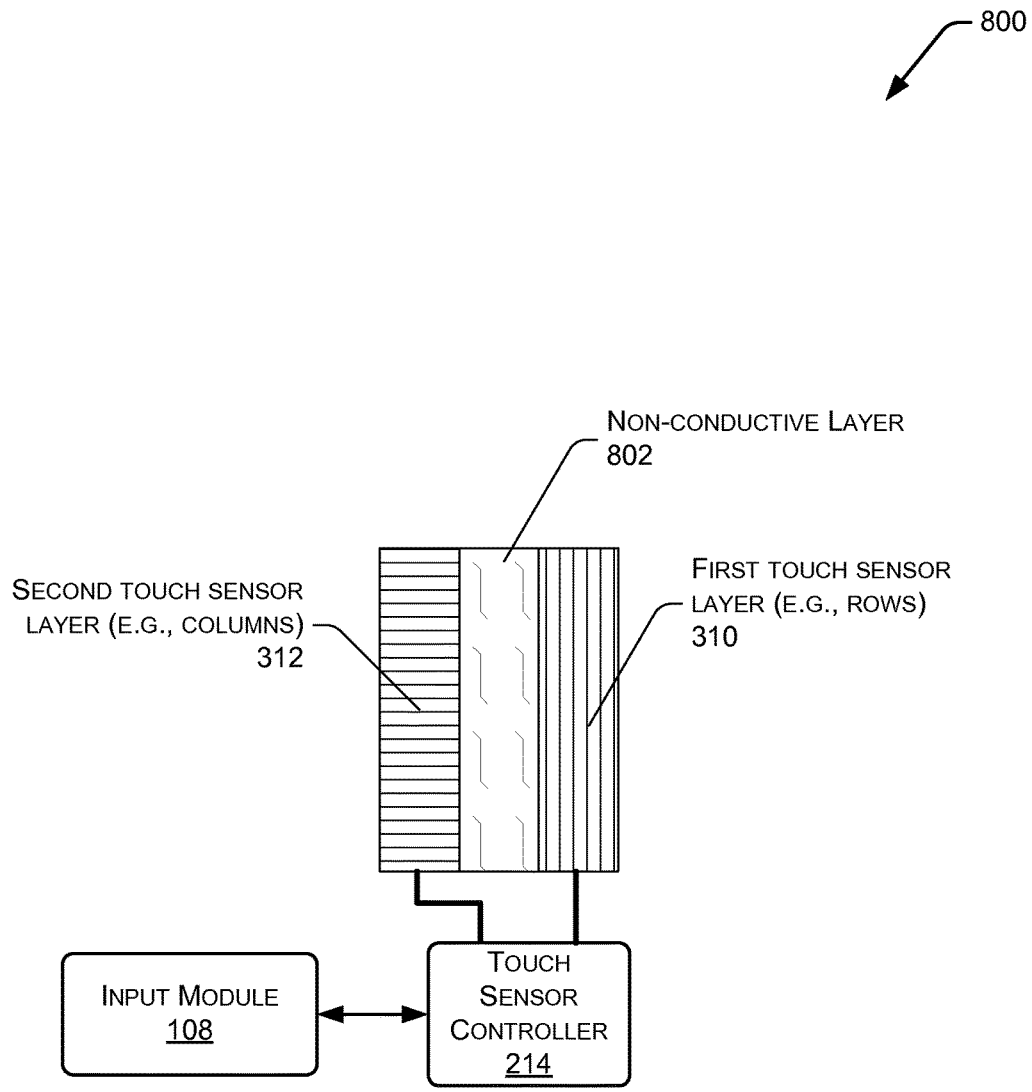
FIG. 8 is a cross-sectional illustration of a capacitive touch sensor array comprising a modified IFSR touch sensor array with a non-conductive middle layer.

FIG. 8 is a cross-sectional illustration 800 of a capacitive touch sensor array comprising a modified IFSR touch sensor array with a non-conductive middle layer. In this implementation, a non-conductive layer 802 separates the first touch sensor layer 310 and the second touch sensor layer 312. The non-conductive or insulating layer 802 removes a conductive path through which the resistive mode operates, leaving the capacitive mode. The non-conductive layer 802 may be selected with dielectric properties which enhance the capacitive effect. Because the IFSR sensor 104 layers may be printed, this implementation allows for the fabrication of an inexpensive capacitive sensor without etching, sputtering, or other expensive fabrication techniques called for in conventional capacitive sensors. Furthermore, this configuration may also be used in conjunction with the active stylus describe below with regards to FIGS. 12-16.

In a similar fashion to that used with regards to resistive sensing, the touch controller 214 may interpolate location of one or more touches based upon the output of the touch sensor 104 operating in capacitive mode. By scanning the rows and columns and measuring the magnitude of the capacitive response, touches between intersections may thus be determined.

Combining Discrete IFSR and Capacitive Sensors

Figure 9:
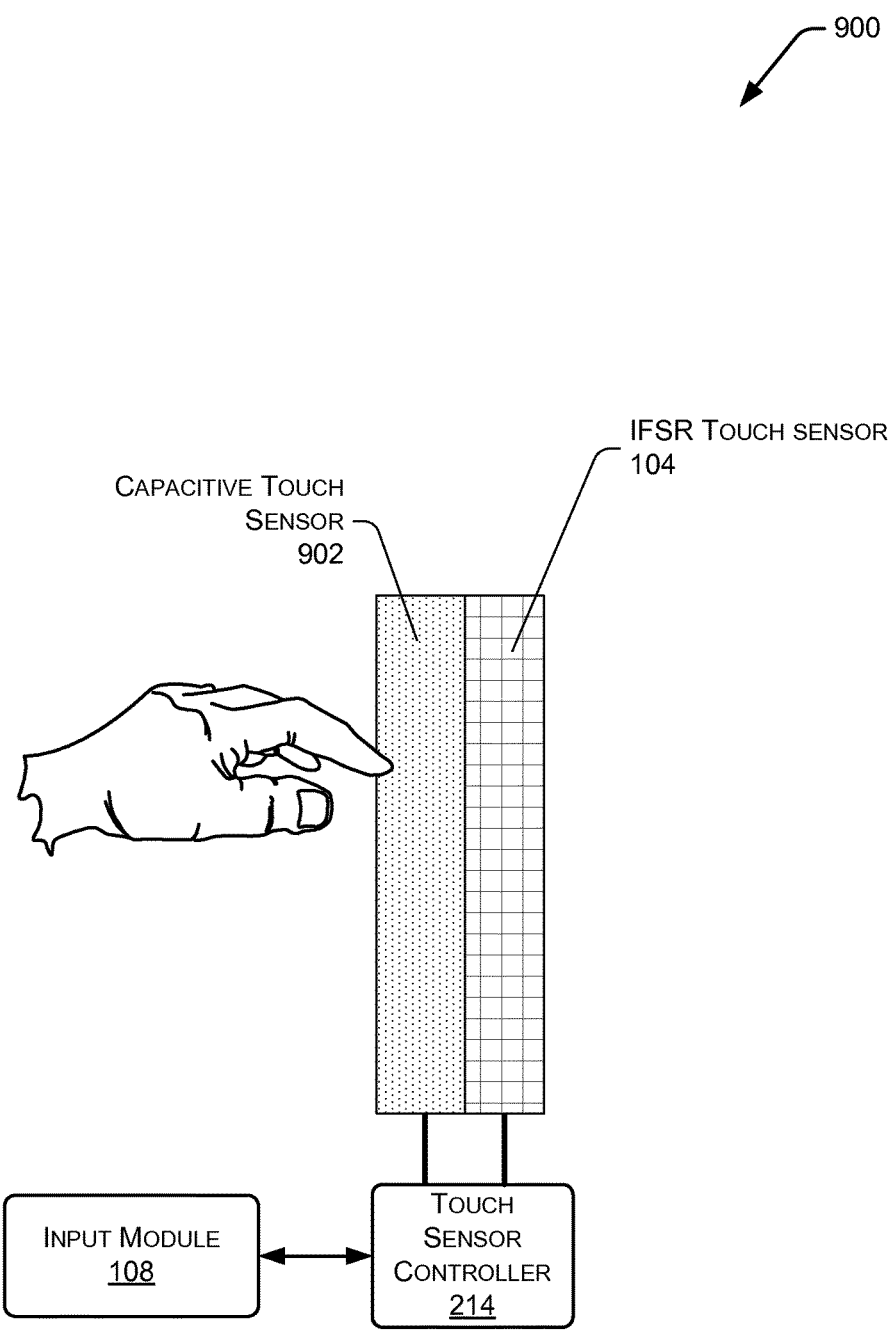
FIG. 9 is a cross-sectional illustration of an IFSR touch sensor operating in resistive mode coupled with a capacitive touch sensor.

FIG. 9 is a cross-sectional illustration 900 of an IFSR touch sensor 104 operating in a primarily resistive mode coupled with a capacitive touch sensor 902. The two sensors may be arranged adjacent to and coincident with each other, such as one behind another. In such an implementation, rows and/or columns of the sensors may be shared, such that the given row/column is an operational component of both sensors. In an alternative implementation, the two sensors may be distributed in an alternating row, grid, or other pattern such that they are side-by side.

Both touch sensors may be configured to share a common field of view. The touch sensor controller 214 receives the signals from the touch sensors and provides data to the input module 108. The data from both touch sensors may be compared to provide the characterization capabilities described above. For example, a touch which is detected by the IFSR array 104 but not by the capacitive sensor 902 may be characterized as a stylus touch.

Figure 10:
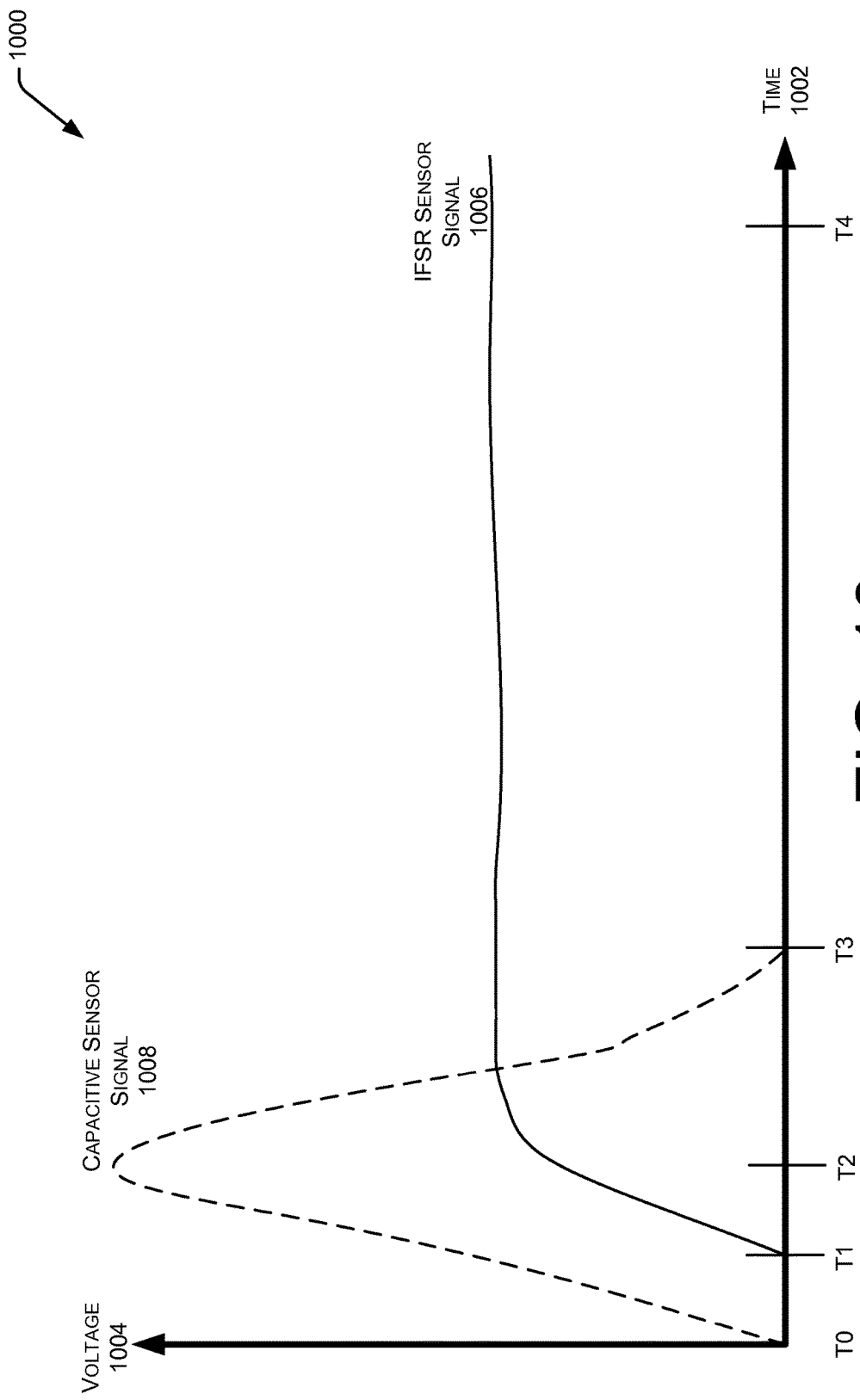
FIG. 10 illustrates temporal voltage profiles from an IFSR touch sensor in resistive mode operating in conjunction with a capacitive touch sensor.

FIG. 10 illustrates temporal voltage profiles 1000 from the combined IFSR and capacitive sensors. The curves depicted in the temporal voltage profiles 1000 are provided by way of illustration, and not limitation. In this illustration, a touch is detected by both sensors, and the touch controller 214 produces two temporal voltage profiles 1000. Time 1002 is indicated along an X axis while voltage 1004 is indicated along a perpendicular Y axis. For this illustration, assume the user approaches the sensor from time T0 and contacts the sensor at time T1. A signal from the IFSR sensor 1006 is shown in a solid line, while a capacitive sensor signal 1008 is shown with a broken line.

Inspection of the IFSR sensor signal 1006 for the touch sensor operating in resistive mode shows no signal from T0 to time T1, followed by the characteristic increase in signal amplitude from T1 to T2 to a relatively steady state voltage which is relatively constant from T3 to T4. In contrast, inspection of the capacitive sensor signal 1008 shows the increase from time T0 to T1 resulting from projected capacitive coupling prior to contact, followed by an increase due to direct capacitive effects from time T1 to T2. The capacitive effects decrease from the peak at T2 to zero at T3.

By assessing the profiles associated with both signals, it is possible to characterize a touch as described above with respect to FIGS. 4-5. For example, based upon the two signals here, the object touching the touch sensor 104 may be characterized as a finger and not a stylus due to the capacitive signal of time T0 to T1 as compared to the IFSR sensor signal 1006 during that same interval.

Figure 11:
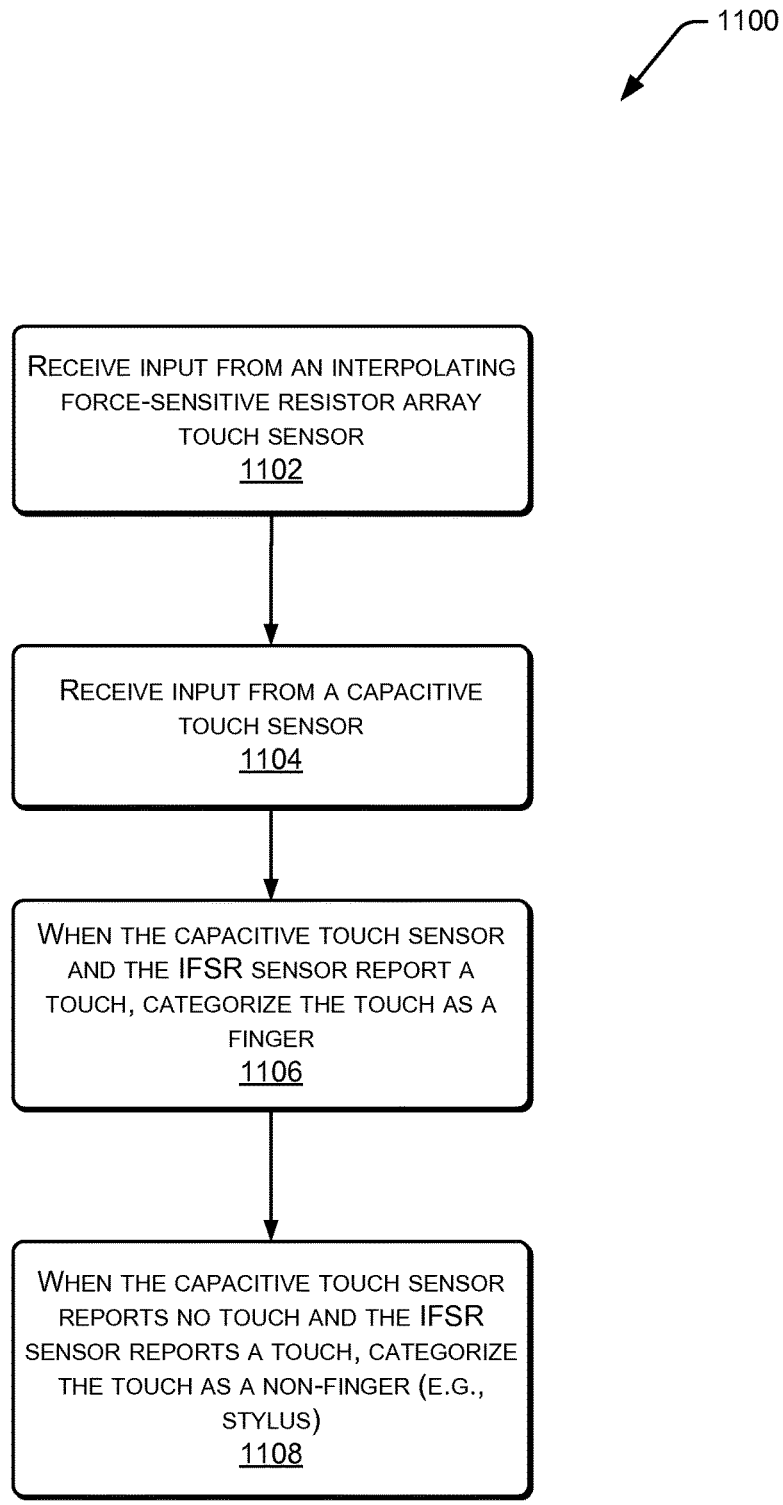
FIG. 11 is an illustrative process of assessing data from an IFSR touch sensor operating in resistive mode and a capacitive touch sensor to characterize a touch.

FIG. 11 is an illustrative process 1100 of assessing data from a composite sensor that combines an IFSR touch sensor 104 operating in resistive mode and a capacitive touch sensor 902 to characterize a touch. At 1102, the input module receives input from the IFSR array touch sensor 104. The input may resemble, for example, the signal 1006 shown in FIG. 10. At 1104, the input module receives input from the capacitive touch sensor 902. The input may resemble, for example, the signal 1008 shown in FIG. 10. This input may be received simultaneously, contemporaneously, or alternately from the two touch sensors.

At 1106, when the capacitive touch sensor 902 and the IFSR touch sensor 104 report a touch at substantially the same position, the input module 108 categorizes the touch as a finger. At 1108, when the capacitive touch sensor 902 reports no touch and the IFSR touch sensor 104 reports a touch at the position, the input module 108 categorizes the touch as a non-finger. For example, a plastic stylus may not capacitively couple strongly enough to the capacitive touch sensor 902 to generate an input signal. However, the same plastic stylus may be pushing such that a resistive signal is generated with the IFSR touch sensor 104.

Active Stylus

Figure 12:
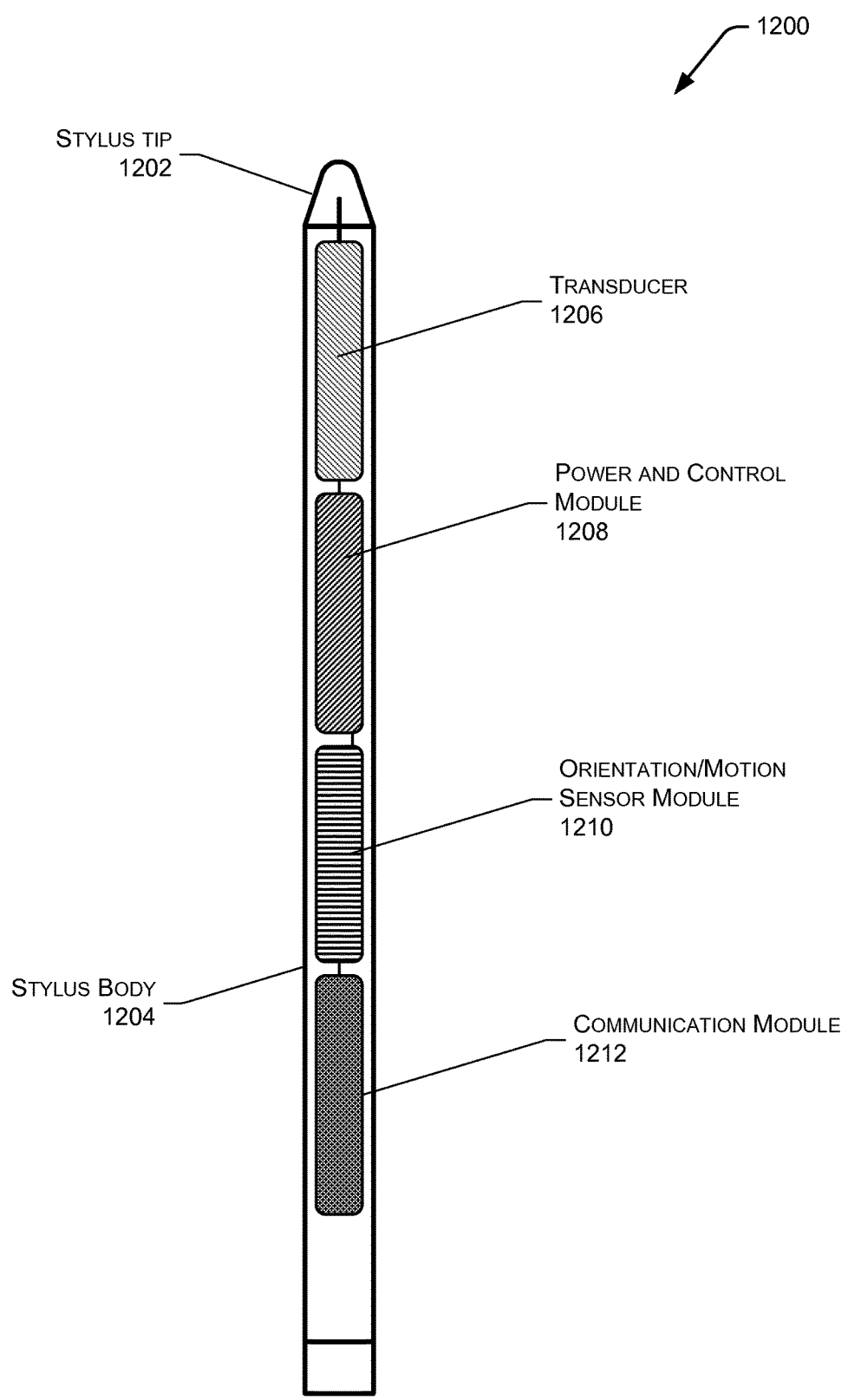
FIG. 12 is a cross-sectional illustration of an active stylus.

FIG. 12 is a cross-sectional illustration of an active stylus 1200. The active stylus 1200 operates in conjunction with the touch sensor 104 to determine a position of the stylus relative to the touch sensor 104, and in some situations an orientation of the stylus.

The active stylus 1200 may comprise a stylus tip 1202 suitable for contact with the touch sensor 104, coupled to or integral with a stylus body 1204. The stylus body 1204 encloses a transducer 1206 configured to receive, transmit, or receive and transmit electromagnetic or electric signals. For example, the transducer may be configured to generate a radio frequency signal, an electric field from a capacitor, and so forth.

Coupled to the transducer 1206, a power and control module 1208 may contain a processor, memory, and other circuitry suitable for performing the functions of the active stylus 1200 as described herein. A battery, capacitor, or other storage device may be used to provide power, while inductive or capacitive coupling with the device 100 may be used to provide electrical power to operate the active stylus 1200.

An orientation/motion sensor module 1210 may be present within the active stylus 1200. This module may include one or more accelerometers, gyroscopes, magnetic field sensors, gravimeters, and so forth. These sensors may be used to determine a position and orientation of the stylus relative to the touch sensor 104. In some implementations, the orientation may be determined independent of the touch sensor 104, such as by a gravimeter.

A communication module 1212 couples to the power and control module 1208 and allows the active stylus 1200 to communicate with the device 100. The communication module 1212 may exchange data with the device 100 via optical, acoustic, electromagnetic, hardwired, or other means. In some implementations the communication module 1212 may utilize the Bluetooth standard.

Figure 13:
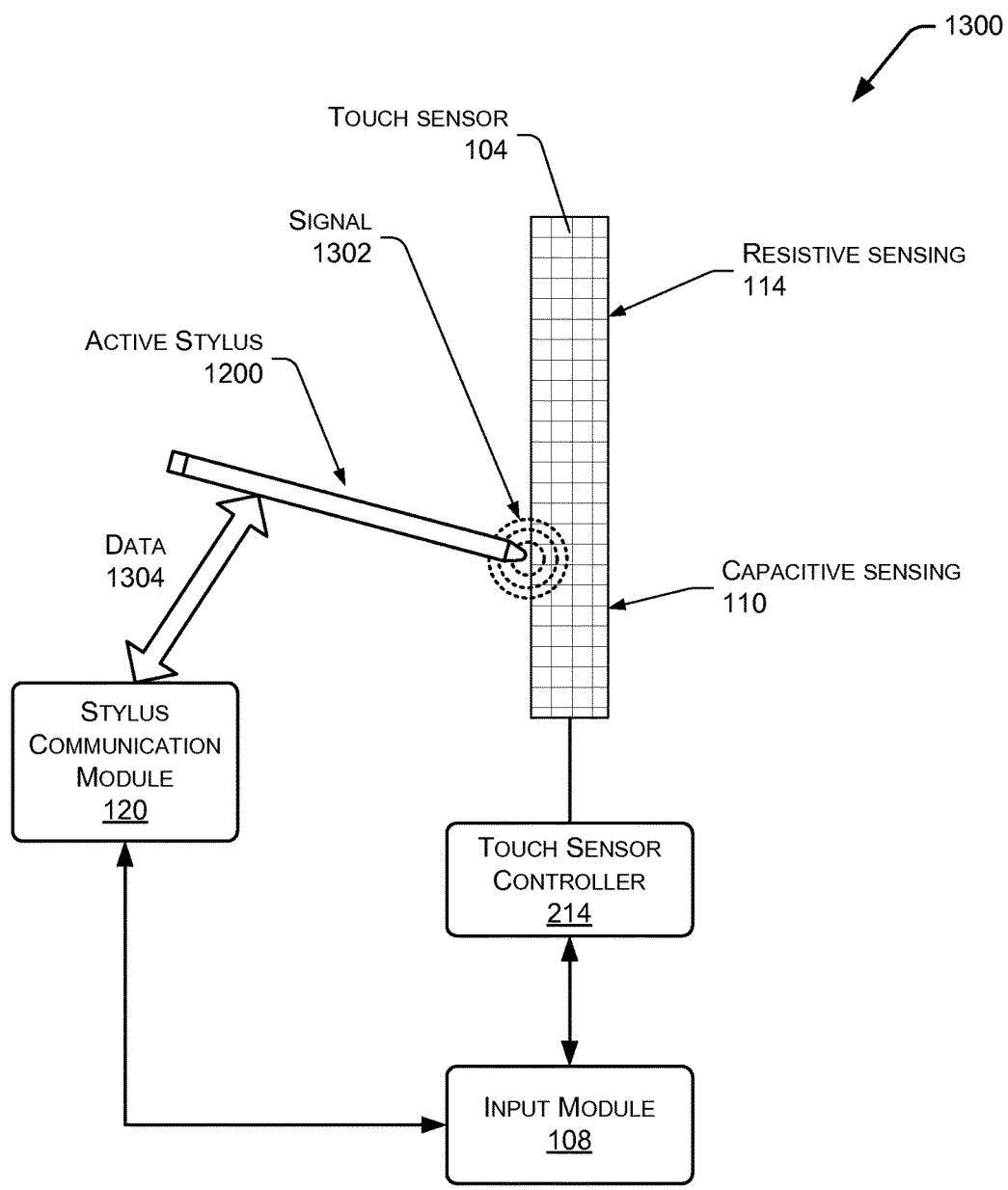
FIG. 13 illustrates an active stylus interacting with a touch sensor to determine position based on signals emitted by the active stylus and received by the touch sensor, or vice versa.

FIG. 13 illustrates 1300 an active stylus 1200 interacting with a touch sensor 104 to determine position based on signals emitted by the active stylus and received by the touch sensor, or vice versa. As shown here, a signal 1302 between the active stylus 1200 and the touch sensor 104 is used to determine position. The active stylus 1200 may also exchange data 1304 with the input module 108 via the stylus communication module 120 coupled to the device 100. While using the active stylus 1200, the touch sensor 104 may continue to provide resistive sensing 114, capacitive sensing 110, or both.

In one implementation, a signal may be generated by the touch sensor 104, which is then received by the active stylus 1200. Position of the active stylus may be determined by comparing the received signal with a known scan pattern, timing, modulation of the signal, and so forth.

In another implementation, the active stylus 1200 may generate the signal which is received by the IFSR array 104. The active stylus 1200 is configured to emit a signal which is received at one or more junctions within the IFSR array 104. By analyzing which junctions have received the signal and signal characteristics of strength, the touch sensor controller 214 may determine the position of the active stylus 1200 relative to the touch sensor 104.

Regardless of whether the active stylus 1200 or the touch sensor 104 generates the signal, the IFSR array 104 may continue to operate in resistive, capacitive, or both modes while using the active stylus 1200. Thus the various capabilities of the touch sensor 104 to sense near touches, light touches, and characterize touches remains intact.

Touches associated with the active stylus 1200 may be interpolated in a similar fashion as the resistive and capacitive touches. This interpolating allows for the touch sensor 104 to be scanned at a relatively low resolution, while still maintaining tracking ability. Higher resolution may be required when tracking multiple touches close to one another.

Figure 14:
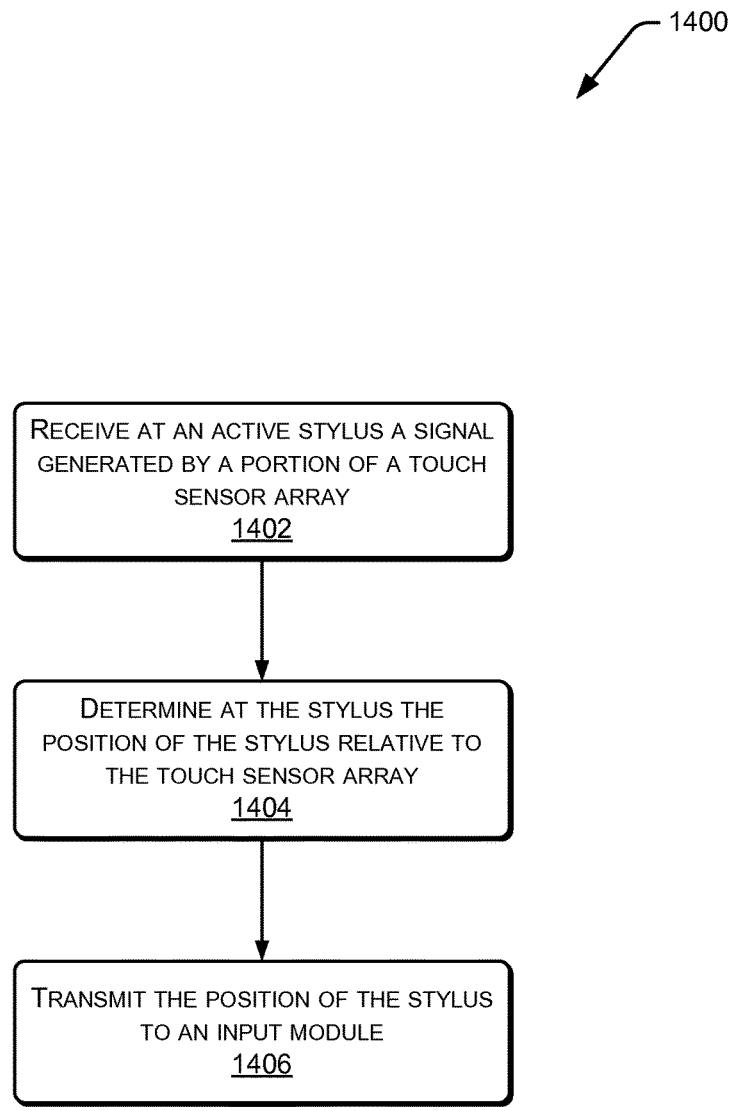
FIG. 14 is an illustrative process of determining a relative position of an active stylus by receiving a signal emitted by the touch sensor.

FIG. 14 is an illustrative process 1400 of determining a position of an active stylus receiving a signal relative to a touch sensor emitting the signal. At 1402, the active stylus 1200 receives a signal generated by a portion of the touch sensor array 104. For example, the touch controller 214 may sequentially scan the touch sensor array 104 to generate a series of signals at intersections.

At 1404, the active stylus 1200 determines the position of the stylus relative to the touch sensor array. For example, the signal generated by the touch sensor 104 may be modulated to indicate which intersection is active at a given moment.

At 1406, the active stylus 1200 may transmit to the device 100 the position of the active stylus 1200 for use by the input module 108. In some implementations, the active stylus 1200 may also transmit orientation information.

Figure 15:
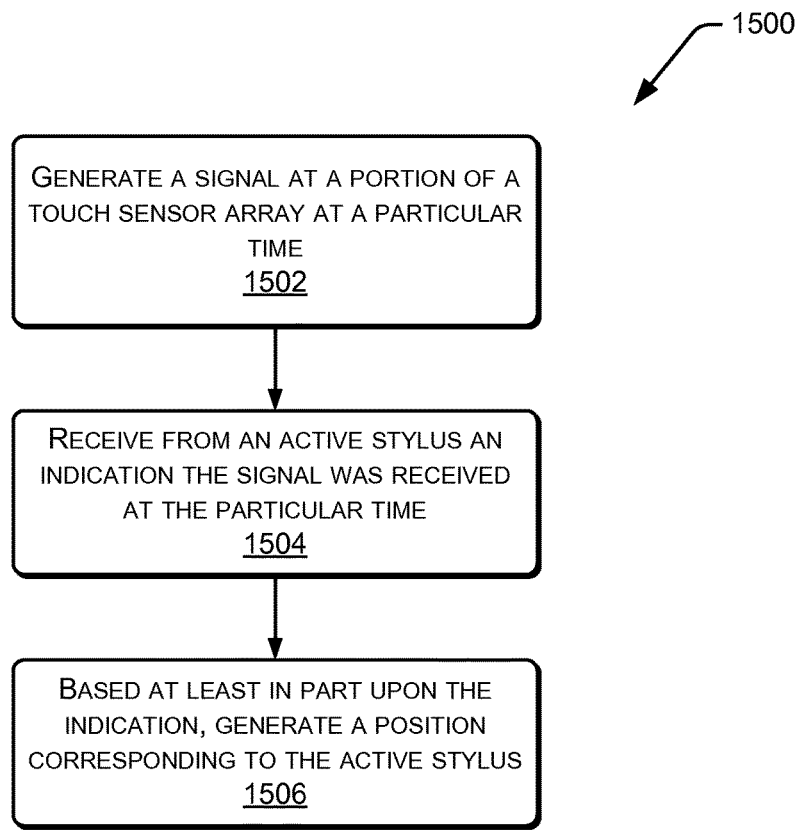
FIG. 15 is an illustrative process of determining a relative position of an active stylus by receiving a signal emitted by the touch sensor and based upon timing of signal receipt.

FIG. 15 is an illustrative process 1500 of determining a position of an active stylus receiving a signal relative to a touch sensor emitting the signal based upon timing of signal receipt. At 1502, the touch controller 214 sequentially scans the touch sensor array 104 to generate a series of signals at intersections in a pre-determining sequence where timing corresponds to a particular location on the touch sensor. For example, the touch controller 214 may scan and generate signals at a successive intersection every 1 milliseconds.

At 1504, the touch controller 214 receives from the active stylus 1200 an indication that the signal was received at the particular time. For example, a simple binary signal indicating the touch sensor's signal was detected is transmitted from the active stylus 1200 to the touch controller 214. The magnitude of the signal strength detected may also be sent in some implementations, and used by the touch controller 214 to interpolate position.

At 1506, based at least in part upon the indication, the touch controller 214 generates a position corresponding to the active stylus 1200. Unlike the method of FIG. 14, in this process the active stylus 1200 does not determine its position.

Figure 16:
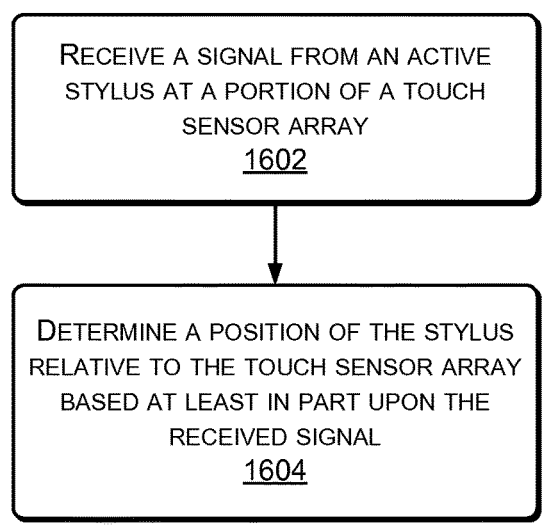
FIG. 16 is an illustrative process of determining a position of an active stylus which emits a signal received by a touch sensor.

FIG. 16 is an illustrative process 1600 of determining a position of an active stylus emitting a signal relative to a touch sensor receiving the signal. At 1602, a signal from an active stylus is received at a portion of the touch sensor array 104. At 1604, the touch controller 214 determines a position of the stylus relative to the touch sensor array 104 based at least in part upon the received signal. This implementation requires minimal complexity of the active stylus 1200 electronics, which may minimize production costs.

CONCLUSION

Although the subject matter has been described in language specific to structural features and/or methodological acts, it is to be understood that the subject matter defined in the appended claims is not necessarily limited to the specific features or acts described. Rather, the specific features and acts are disclosed as illustrative forms of implementing the claims. For example, the methodological acts need not be performed in the order or combinations described herein, and may be performed in any combination of one or more acts.

What is claimed is:

1. A device comprising:

an interpolating force-sensitive resistor array touch sensor comprising two layers, a first layer comprising a column of electrodes and a second layer comprising a row of electrodes and a resistive material filling gaps between the electrodes of the first layer and the electrodes of the second layer to act as a linear resistor, the resistive material having an electrical resistance that varies in relation to a force applied to the resistive material; and non-transitory computer-readable media storing instructions that, when executed by one or more processors, cause the one or more processors to perform operations comprising:

receiving voltage data from a touch controller coupled to the interpolating force-sensitive resistor array touch sensor;

generating a temporal voltage profile based at least in part on the voltage data, the temporal voltage profile indicating a capacitive effect and a resistive effect over time on the interpolating force-sensitive resistor array touch sensor from a touch input; and analyzing the temporal voltage profile so as to determine that the temporal voltage profile corresponds to at least one of a resistive touch input or a capacitive touch input.

2. The device of claim 1, wherein the touch controller is configured to characterize the touch input as a finger or non-finger based at least in part upon the temporal voltage profile.

3. The device of claim 1, wherein generating the temporal voltage profile comprises:

pulsing a voltage to a first portion of the interpolating force-sensitive resistor array touch sensor; and measuring the voltage over time at a second portion of the force-sensitive resistor array.

4. A device comprising:

an interpolating force-sensitive resistor array touch sensor comprising:
    a first layer comprising a column of electrodes;
    a second layer comprising a row of electrodes; and
    a resistive material which fills gaps between the electrodes of the first layer and the electrodes of the second layer and having an electrical resistance that is altered at least in part by a force applied to the resistive material; and non-transitory computer-readable media storing instructions that, when executed by one or more processors, cause the one or more processors to perform operations comprising:
    receiving voltage data from a touch controller coupled to the interpolating force-sensitive resistor array touch sensor;
    generating a temporal voltage profile based at least in part on the voltage data, the temporal voltage profile indicating a capacitive effect and a resistive effect over time on the interpolating force-sensitive resistor array touch sensor from a touch input; and
    analyzing the temporal voltage profile so as to determine that the temporal voltage profile corresponds to at least one of a resistive touch input or a capacitive touch input.

5. The device of claim 4, wherein the resistive material acts as a linear resistor which allows the touch controller to interpolate a location of the touch input between intersections of the electrode of the first layer and between intersections of the electrodes of the second layer.

6. The device of claim 4, wherein the touch controller characterizes the touch input as corresponding to a finger or non-finger based at least in part upon a comparison of the resistive effect and the capacitive effect.

7. A method comprising:

pulsing a voltage to a first portion of an interpolating force-sensitive resistor array touch sensor comprising a first layer comprising a column of electrodes, a second layer comprising a row of electrodes, and a resistive material which fills gaps between the electrodes of the first layer and the electrodes of the second layer and having an electrical resistance that varies based at least in part on a pressure applied to the resistive material;

measuring a voltage generated by a signal associated with a touch over time at a second portion of the force-sensitive resistor array;

generating a temporal voltage profile from the measured voltage over time, wherein the temporal voltage profile comprises capacitive effects between the electrodes of the first layer and the electrodes of the second layer and resistive effects between the electrodes of the first layer and the electrodes of the second layer; and analyzing the temporal voltage profile so as to determine that the temporal voltage profile corresponds to at least one of a resistive touch input or a capacitive touch input.

8. The method of claim 7, further comprising characterizing the touch input at the touch sensor, the characterizing comprising:

determining when a voltage spike associated with capacitive coupling of a portion of the array is present within the temporal voltage profile;

determining when a steady state voltage over a predetermined period of time associated with a resistive contact within a portion of the array is present within the temporal voltage profile;

when the voltage spike and the steady state voltage are present, categorize the touch input as a user touch; and when the voltage spike is absent and the steady state voltage is present, categorize the touch input as a non-user touch.

9. A device comprising:

an interpolating force-sensitive resistor array touch sensor comprising a first layer comprising a column of electrodes, a second layer comprising a row of electrodes, and a resistive material which fills gaps between the electrodes of the first layer and the electrodes of the second layer and having an electrical resistance that changes based at least in part on a pressure applied to the resistive material; and non-transitory computer-readable media storing instructions that, when executed by one or more processors, cause the one or more processors to perform operations comprising:
    receiving voltage data from a touch controller coupled to the interpolating force-sensitive resistor array touch sensor;
    generating a temporal voltage profile based at least in part on the voltage data, the temporal voltage profile indicating a capacitive effect and a resistive effect over time on the interpolating force-sensitive resistor array touch sensor from a touch input; and
    analyzing the temporal voltage profile so as to determine that the temporal voltage profile corresponds to at least one of a resistive touch input or a capacitive touch input.

10. The device of claim 9, wherein the touch controller is further configured to characterize the touch input as corresponding to a finger or a non-finger based at least in part upon a comparison of the resistive effect and the capacitive effect associated with the touch input.

11. The device of claim 9, the operations further comprising:

communicating with an active stylus; and determining a position of the active stylus relative to the touch sensor.

12. The device of claim 11, wherein the touch sensor emits a signal and the active stylus is configured to receive the signal and determine a position relative to the touch sensor.

13. The device of claim 11, wherein the touch sensor emits the signal at a particular time and receives from the active stylus an indication that the signal was received at the particular time.

14. The device of claim 11, wherein the active stylus emits a second signal and the touch sensor is configured to receive the second signal.

15. A device comprising:
a composite touch sensor comprising:
  a capacitive touch sensor;
  an interpolating force-sensitive resistor array touch sensor disposed adjacent to and coincident with the capacitive touch sensor, the interpolating force-sensitive resistor array touch sensor comprising a first layer comprising a column of electrodes, a second layer comprising a row of electrodes, and a third layer between the electrodes of the first layer and second layer including a resistive material filling gaps between the electrodes of the first layer and the electrodes of the second layer and having an electrical resistance that is altered at least by changes in a force applied to the resistive material; and
  non-transitory computer-readable media storing instructions that, when executed by one or more processors, cause the one or more processors to perform operations comprising:
    receiving voltage data from a touch controller coupled to the interpolating force-sensitive resistor array touch sensor;
    generating a temporal voltage profile based at least in part on the voltage data, the temporal voltage profile indicating a capacitive effect and a resistive effect over time on the interpolating force-sensitive resistor array touch sensor from a touch input; and
    analyzing the temporal voltage profile so as to determine that the temporal voltage profile corresponds to at least one of a resistive touch input or a capacitive touch input.

16. The device of claim 15, wherein the interpolating force-sensitive resistor array touch sensor is positioned between a point of contact and the capacitive touch sensor.

17. The device of claim 15, wherein the operations further comprise characterizing the touch input based at least in part upon a comparison of output from the touch sensors.

18. A method comprising:
  receiving a first input from an interpolating force-sensitive resistor array touch sensor comprising a first layer comprising a column of electrodes, a second layer comprising a row of electrodes and a third layer between the electrodes of the first layer and the second layer including a resistive material filling gaps between the electrodes of the first layer and the electrodes of the second layer and having an electrical resistance that varies in relation to an amount of pressure applied to the resistive material, the first input representing resistive effects detected by the interpolating force-sensitive resistor array touch sensor;
  receiving a second input from a capacitive touch sensor disposed adjacent to the interpolating force-sensitive resistor array touch sensor, the second input representing capacitive effects detected by the capacitive touch sensor;
  generating a temporal voltage profile based at least in part on the first input and the second input, the temporal voltage profile indicating the capacitive effects and resistive effects over time; and
  analyzing the temporal voltage profile so as to determine that the temporal voltage profile corresponds to at least one of a resistive touch input or a capacitive touch input.

19. The method of claim 18, wherein the touch input is characterized as:
  a first touch type when the capacitive touch sensor and the interpolating force-sensitive resistor array touch sensor report the touch input at substantially the same location; or
  a second touch type when the capacitive touch sensor reports no touch input at a location and the interpolating force-sensitive resistor array touch sensor reports the touch input at the location.

20. The method of claim 19, wherein the first touch type comprises a finger or hand and the second touch type comprises an inanimate object.

21. The method of claim 19, wherein the resistive material acts as a linear resistor which allows a touch controller to interpolate the location of the touch input between intersections of the electrode of the first layer and between intersections of the electrodes of the second layer.

22. The device of claim 1, wherein the resistive material capacitively couples the electrodes of the first layer with the electrodes of the second layer such that if a charge is applied to one or more particular electrodes of the first layer, the charge is introduced to one or more overlapping electrodes of the second layer.

* * * * *